United States Patent
Painting et al.

(10) Patent No.: US 11,821,925 B2
(45) Date of Patent: Nov. 21, 2023

(54) ACCESSORY FOR UTILIZATION WITH NON-CONTACT ELECTRICAL DETECTOR

(71) Applicant: Fluke Corporation, Everett, WA (US)

(72) Inventors: Brian D. Painting, Everett, WA (US);
Luis R. Silva, Everett, WA (US);
Ginger M. Woo, Everett, WA (US);
Ronald Steuer, Brunn am Gebirge (AT)

(73) Assignee: Fluke Corporation, Everett, WA (US)

( * ) Notice: Subject to any disclaimer, the term of this patent is extended or adjusted under 35 U.S.C. 154(b) by 4 days.

(21) Appl. No.: 17/521,703

(22) Filed: Nov. 8, 2021

(65) Prior Publication Data

US 2023/0143997 A1     May 11, 2023

(51) Int. Cl.
*G01R 19/00*     (2006.01)
*H01R 11/24*     (2006.01)
(Continued)

(52) U.S. Cl.
CPC ......... *G01R 19/0084* (2013.01); *H01R 11/24* (2013.01); *H01R 13/447* (2013.01);
(Continued)

(58) Field of Classification Search
CPC .. H01R 13/6683; H01R 13/665; H01R 24/68; H01R 13/713; H01R 13/7135;
(Continued)

(56) References Cited

U.S. PATENT DOCUMENTS

| | | | | |
|---|---|---|---|---|
| 6,020,822 A | * | 2/2000 | Marshall | G01R 19/155 324/156 |
| 7,249,976 B1 | * | 7/2007 | Watson | H01R 13/71 439/651 |

(Continued)

FOREIGN PATENT DOCUMENTS

EP     3318883 B1     5/2020

OTHER PUBLICATIONS

Extended European Search Report for EP 22206097.2-1001, dated Mar. 22, 2023, 12 pages.

*Primary Examiner* — Vinh P Nguyen
(74) *Attorney, Agent, or Firm* — SEED INTELLECTUAL PROPERTY LAW GROUP LLP

(57) ABSTRACT

Accessories are removably received by a non-contact electrical detector for measuring an electrical characteristic without galvanic contact between the accessory and a non-contact sensor in the non-contact electrical detector. In some embodiments, an accessory is positioned in a gap between first and second extensions of the non-contact electrical detector. In some embodiments, an accessory includes first and second recesses on opposite sides of the accessory. First and second clamp arms of a non-contact electrical detector are inserted within the first and second recesses to removably hold the accessory. An external conductive prong of the accessory is electrically coupled, or is selectively electrically coupleable, with an internal conductive prong of the accessory. The external conductive prong is configured to be inserted into a receptacle of an electrical outlet. In use, the accessory positions the internal conductive prong within a sensing area of the non-contact electrical sensor of the non-contact electrical detector.

18 Claims, 12 Drawing Sheets

(51) Int. Cl.
*H01R 13/447* (2006.01)
*H01R 13/66* (2006.01)
*H01R 13/70* (2006.01)

(52) U.S. Cl.
CPC ..... *H01R 13/6683* (2013.01); *H01R 13/6691* (2013.01); *H01R 13/70* (2013.01); *H01R 2201/20* (2013.01)

(58) Field of Classification Search
CPC .... H01R 13/66; H01R 13/7036; H01R 13/10; H01R 24/66; H01R 2105/00; H01R 13/6633; H01R 9/2433; H01R 13/02; H01R 13/743; H01R 33/96; H01R 33/95; H01R 11/24; H01R 13/447; H01R 13/6691; H01R 13/70; H01R 2201/20; G01R 19/0084
See application file for complete search history.

(56) References Cited

U.S. PATENT DOCUMENTS

| | | | | |
|---|---|---|---|---|
| 7,633,282 B2 * | 12/2009 | Radle | ............... | G01R 31/69 |
| | | | | 324/67 |
| 8,496,491 B2 * | 7/2013 | Baek | ............... | H01R 13/71 |
| | | | | 200/51.09 |
| 8,951,075 B2 * | 2/2015 | Ekchian | ............ | H01R 31/06 |
| | | | | 439/692 |
| 10,746,811 B2 * | 8/2020 | Chun | ............... | G01R 31/67 |
| 11,131,692 B1 | 9/2021 | Lee et al. | | |
| 2002/0182905 A1 | 12/2002 | Hedrick et al. | | |
| 2011/0169477 A1 | 7/2011 | Radle et al. | | |
| 2017/0067939 A1 | 3/2017 | Imai et al. | | |

* cited by examiner

ACCESSORY FOR UTILIZATION WITH NON-CONTACT ELECTRICAL DETECTOR

BACKGROUND

Technical Field

The present disclosure pertains to an accessory removably received by a measurement device such as a non-contact electrical detector.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least one measurement electrode or probe into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution.

A non-contact voltage (NCV) detector may be used to detect the presence of alternating current (AC) voltage, typically high voltage, without requiring galvanic contact with the circuit. When a voltage is detected, the user may be alerted by an indication, such as a light, buzzer, or vibrating motor. However, such NCV detectors are generally not capable of determining a voltage behind an electrical outlet.

Thus, there is a need for an accessory to be utilized with the NCV detector that enables the NCV detector to conveniently and accurately measure voltage at or behind an electrical outlet without requiring galvanic contact between a sensor within the NCV detector and an electrical line or circuit being tested at or behind the electrical outlet.

BRIEF SUMMARY

Disclosed herein are accessories (e.g., adapters) that are removably received by a non-contact electrical detector for detecting (e.g., measuring) an electrical characteristic (e.g., voltage, current, or some other type of electrical characteristic) without galvanic contact between the accessory and a non-contact sensor in the non-contact electrical detector. For example, the non-contact electrical detector may be a non-contact voltage (NCV) detector, a non-contact multimeter, or another type of non-contact electrical detector.

In various embodiments of an accessory of the present disclosure, an external conductive prong of the accessory extends outward from a non-conductive body of the accessory. The external conductive prong is configured to be inserted into a receptacle (e.g., neutral, hot, ground, etc.) of an electrical outlet. An internal conductive prong within the non-conductive body of the accessory is electrically coupled, or selectively electrically coupleable, with the external conductive prong. When the accessory is removably received by the non-contact electrical detector, the internal conductive prong is positioned adjacent to the non-contact sensor such that at least a portion of the internal conductive prong is in a sensing area of the non-contact sensor without galvanically contacting the non-contact sensor. The internal conductive prong may be in electrical communication with an electrical line or circuit behind the electrical outlet via the receptacle of the electrical outlet. An electrical signal is transmitted successively from the electrical line or circuit through the external conductive prong to the internal conductive prong. The electrical signal is transmitted by the internal conductive prong so as to be present in the sensing area of the non-contact sensor without galvanically contacting the non-contact sensor such that the non-contact electrical detector may readily detect an electrical characteristic (e.g., voltage, current, or some other type of electrical characteristic) at or behind the electrical outlet.

DETAILED DESCRIPTION

Figure 1:
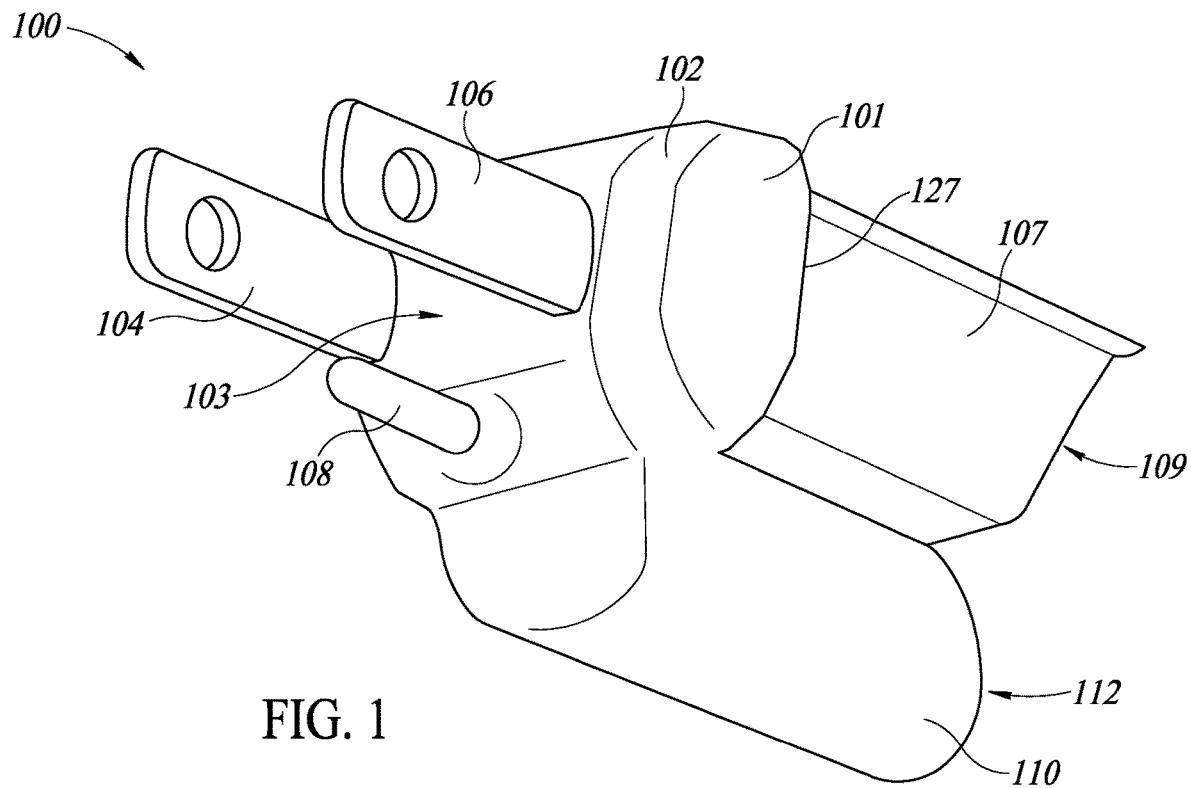
FIG. 1 is a perspective view illustrating an embodiment of an accessory of the present disclosure.

Generally, non-contact electrical detectors have difficulty measuring or detecting an electrical characteristic of an electrical line or circuit located at or behind an electrical outlet. Users may attempt to place the non-contact electrical detector directly adjacent to the electrical outlet, or may attempt to insert a physical portion integral to the non-contact electrical detector into a receptacle of the electrical outlet, to measure or detect an electrical characteristic at or behind the electrical outlet. However, when inserting the physical portion integral to the non-contact electrical detector, the user may break off the physical portion damaging the non-contact electrical detector, which may result in the non-contact electrical detector having to undergo repairs or being broken beyond repair. Even if the user is able to measure or detect any electrical characteristic by inserting the physical portion of the non-contact electrical detector into the receptacle, the measurement or detection by the non-contact electrical detector may not be accurate or within preferred tolerances such that information, data, or measurements output by the non-contact electrical detector may not be reliable and accurate.

Disclosed herein are embodiments of accessories (e.g., adapters, plugs, etc.) for utilization with a non-contact electrical detector to assist in detecting any number of electrical characteristics behind or at an electrical outlet. For example, an embodiment of an accessory (e.g., plug) of the present disclosure is removably received by the non-contact electrical detector. The accessory includes at least one external conductive prong structured and configured to be inserted into a receptacle of an electrical outlet. The external conductive prong extends from a non-conductive body of the accessory and is electrically coupled, or selectively electrically coupleable, with an internal conductive prong within the non-conductive body. The external conductive prong conducts an electrical signal to the internal conductive prong, and, when the accessory is removably received by the non-contact electrical detector, the internal conductive prong is positioned within a sensing area (e.g., non-contact sensing area) of a non-contact sensor of the non-contact electrical detector. The non-contact sensor then detects an electrical characteristic of the electrical signal conducted by the internal conductive prong, which is an electrical characteristic of the electrical signal in an electrical line or circuit located at or behind the electrical outlet in which the external conductive prong is inserted. The accessory is separate and distinct from the non-contact electrical detector such that the accessory is not a physical portion of the non-contact electrical detector. If the external conductive prong of the accessory breaks off, the non-contact electrical detector is not damaged, and, the broken accessory may instead be removed from the non-contact electrical detector and replaced with a new accessory.

In some embodiments, the accessory has multiple external conductive prongs extending outward from the non-conductive body such that each external conductive prong may be inserted into a corresponding receptacle of an electrical outlet. For example, the electrical outlet may be a three receptacle (e.g., type B) tamper resistant electrical outlet that includes a mechanical feature that limits access to the receptacles of the outlet unless respective prongs are inserted into each receptacle at substantially the same time. Inserting respective prongs at the same time unlocks the mechanical feature and allows the prongs to enter the receptacles of the tamper resistant electrical outlet. In such a case, the accessory may be structured to have three prongs corresponding to the three receptacles of the tamper resistant electrical outlet. This allows the user to insert the accessory into the tamper resistant electrical outlet and measure or detect an electrical characteristic at or behind the outlet, which would be inaccessible if the user was only utilizing the non-contact electrical detector without the accessory.

In some embodiments, a method of utilizing a non-contact electrical detector with an accessory of the present disclosure includes removably positioning a non-conductive body of the accessory in a form factor (e.g., receiving structure) of the non-contact electrical detector. When the accessory is removably received by the non-contact electrical detector, at least one internal conductive prong within the non-conductive body of the accessory is positioned within a sensing area of a non-contact sensor of the non-contact electrical detector, and the at least one internal conductive prong does not galvanically contact the non-contact sensor. At least one external conductive prong extends from the non-conductive body of the accessory that may be inserted into a receptacle of an electrical outlet. The external electrical prong is in electrical communication or in selective electrical communication with the internal conductive prong within the non-conductive body of the accessory. An electrical characteristic in internal conductive prong is detected utilizing the non-contact sensor of the non-contact electrical detector. The electrical characteristic is an electrical characteristic of an electrical line or circuit behind the electrical outlet or at the receptacle of the electrical outlet. In other words, the electrical characteristic is an electrical characteristic external to the non-contact electrical detector that normally would be inaccessible to the non-contact electrical detector without use of the accessory. After detecting the electrical characteristic within the accessory utilizing the non-contact sensor, the method includes outputting an indication of the electrical characteristic detected by the non-contact sensor of the non-contact electrical detector.

While embodiments of accessories of the present disclosure are discussed being utilized with non-contact electrical detectors that are generally non-contact voltage (NCV) detectors configured to detect a voltage, it will be readily appreciated that the embodiments of the accessories of the present disclosure may readily be utilized with other types of non-contact electrical detectors (e.g., a non-contact multimeter, non-contact current detector, or some other type of non-contact electrical detector) for detecting other types of electrical characteristics such as a current.

FIG. 1 is a perspective view illustrating an embodiment of an accessory 100 to be utilized with a non-contact electrical detector of the present disclosure. The accessory 100 is structured to be removably received by the non-contact electrical detector, which will be discussed in further detail herein.

The accessory 100 is a three-prong male electrical plug or connector that may readily be inserted into an electrical outlet. While the embodiment of the accessory 100 as shown in FIG. 1 is a type B plug generally utilized in the United States, in some embodiments, the third external conductive prong may not be present such that the accessory 100 is a type A plug generally utilized in the United States. In some embodiments, the accessory 100 may have external conductive prongs corresponding to a Type C, D, E, F, G, H, I, J, K, L, M, or N plug that is generally utilized in other countries outside of the United States. In other words, external conductive prongs may extend outward from a first end of a non-conductive body in any number of configurations or patterns for use with any number of electrical outlets having any number of configurations or patterns. In some embodiments, the accessory 100 may have a single external conductive prong. For the sake of simplicity and brevity of the present disclosure, the following discussion with respect to the accessory 100 will focus on an accessory having a Type B structure as shown in FIG. 1.

The accessory 100 includes a non-conductive body 101, which may be made of an electrically non-conductive material such as a rubber material, a rubber composite material, a non-conductive composite material, a plastic material, a plastic composite material, or some other suitable type of non-conductive or insulating material or combination of non-conductive or insulating materials. The non-conductive body 101 includes a first portion 102 at a first end 103 at which a first external conductive prong 104, a second external conductive prong 106, and a third external conductive prong 108 extend outward and away from the non-conductive body 101. The first portion 102 may be referred to as a prong portion of the accessory 100. The first portion 102 may have any shape, including a cuboid shape with straight or rounded edges or other similar three-dimensional shape. In some embodiments, the first portion 102 has a cylindrical shape, a cylindrical-like shape, or other similar three-dimensional shape. The non-conductive body is sized and shaped to be received by a corresponding form factor (e.g., receiving structure) of a non-contact electrical detector.

The first, second, and third external conductive prongs 104, 106, 108 may extend into the non-conductive body 101 such that respective ends of the external conductive prongs are held within the non-conductive body 101. In some embodiments, the first external conductive prong 104 is a hot external conductive prong to be inserted into a hot receptacle of an electrical outlet, the second external conductive prong 106 is a neutral external conductive prong to be inserted into a neutral receptacle of the electrical outlet, and the third external conductive prong 108 is a ground external conductive prong to be inserted into a ground receptacle of the electrical outlet.

As shown in FIG. 1, the first and second external conductive prongs 104, 106 are flat and the third external conductive prong 108 is rounded. In some embodiments, the first and second external conductive prongs 104, 106 are rounded. In some embodiments, the third external conductive prong 108 is flat.

The non-conductive body 101 includes a second portion 107 at a second end 109 of the non-conductive body 101, which is opposite to the first end 103 of the non-conductive body 101. The second portion 107 may be a male structure such as a protrusion, an extension, a boss, or some other type of male structure of the non-conductive body 101 to be received by a corresponding female receiving structure of a non-contact electrical detector. In some embodiments, the second portion 107 may be a female structure of the non-conductive body 101 configured to receive a corresponding male structure of a non-contact electrical detector. Additionally, a first surface 125 of the first portion 102 extends transverse from the second portion 107 of the non-conductive body 101 forming a shelf in a first direction, and a second surface 127 of the first portion 102 extends transverse from the second portion 107 of the non-conductive body 101 forming a shelf in a second direction opposite to the first direction.

A third portion 110 of the non-conductive body 101 may include a wire reception portion or connector. In the embodiment shown, the third portion 110 extends from the first end 103 to the second end 109 of the accessory 100. The third portion 110 may have a cylindrical shape, a cylindrical-like shape, or some other three-dimensional shape. However, in some embodiments, the third portion 110 has a cuboid shape with straight edges, a cuboid-like shape with straight edges, or some other three-dimensional shape. The third portion 110 includes a female electrical receptacle 112 at the second end 109 of the accessory 100. For example, the female electrical receptacle 112 may be female coaxial electrical receptacle structure to receive a male coaxial electrical plug of a wire. The female electrical receptacle 112 may be electrically coupled to the third external conductive prong 108 of the accessory 100. In cases where the third external conductive prong 108 is inserted into a ground receptacle of an outlet, the third external conductive prong 108 grounds the accessory 100 which, as described below, is useful when the accessory 100 is utilized with a non-contact electrical detector to measure an electrical characteristic such as a voltage, a current, or some other type of electrical characteristic.

Figure 2:
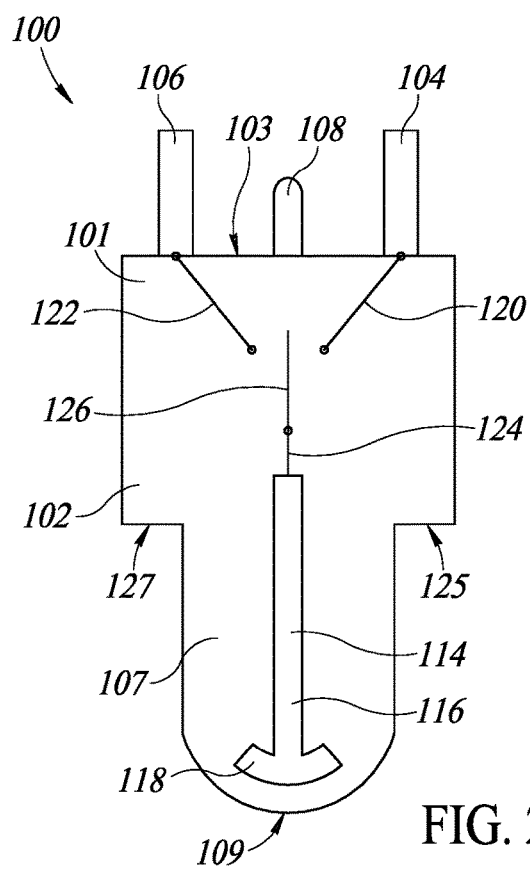
FIG. 2 is a top cross-sectional schematic diagram illustrating an embodiment of the accessory shown in FIG. 1.

FIG. 2 is a schematic diagram of a top cross-sectional view of an embodiment of the accessory 100 shown in FIG. 1. An internal conductive prong 114 within the non-conductive body 101 has a first portion 116 and a second portion 118 which is wider than the first portion 116. The second portion 118 is closer to the second end 109 than the first end 103 relative to the first portion 116. The second portion 118 is adjacent to the second end 109 of the non-conductive body 101. The first portion 116 is coupled to the second portion 118 or otherwise integral with the second portion 118.

A first electrical pathway 120 within the non-conductive body 101 is electrically coupled to the first external conductive prong 104 and extends from the first external conductive prong 104 towards the internal conductive prong 114. The first electrical pathway 120 may be a wire electrically coupled to the first external conductive prong 104, a plurality of wires electrically coupled together with at least one electrically coupled to the first external conductive prong 104, or may be some other type of electrical connection structure electrically coupled to the first external conductive prong 104.

A second electrical pathway 122 within the non-conductive body 101 is electrically coupled to the second external conductive prong 106. The second electrical pathway 122 is electrically isolated from the first external conductive prong 104 and the first electrical pathway 120 such that electrical cross-talk does not occur between the first electrical pathway 120 and the second electrical pathway 122. The second electrical pathway 122 extends from the second external conductive prong 106 towards the internal conductive prong 114. The second electrical pathway 122 may be a wire electrically coupled to the second external conductive prong 106, a plurality of wires electrically coupled together with at least one electrically coupled to the second external conductive prong 106, or may be some other type of electrical connection structure electrically coupled to the second external conductive prong 106.

A third electrical pathway 124 within the non-conductive body 101 is electrically coupled to the internal conductive prong 114. The third electrical pathway 124 extends through the non-conductive body 101 from the internal conductive prong 114 towards the first and second external conductive prongs 104, 106. The third electrical pathway 124 may be a wire electrically coupled to the internal conductive prong 114, a plurality of wires electrically coupled together with at least one electrically coupled to the internal conductive prong 114, or may be some other type of electrical connection structure electrically coupled to the internal conductive prong 114.

A switch 126 within the non-conductive body 101 is electrically coupled to the third electrical pathway 124. The switch 126 is selectively electrically coupleable with the first electrical pathway 120 and the second electrical pathway 122. The switch 126 may be a mechanical switch or an electrical switch to selectively electrically couple the first and second electrical pathways 120, 122 to the third electrical pathway 124. For example, when the switch 126 is a mechanical switch, the switch 126 may be selectively moved to a first position in which the switch 126 electrically couples the first external conductive prong 104 to the internal conductive prong 114 through the first electrical pathway 120, the switch 126, and the third electrical pathway 124. The switch 126 may also be selectively moved to a second position in which the switch 126 electrically couples the second external conductive prong 106 to the internal conductive prong 114 through the second electrical pathway 122, the switch 126, and the third electrical pathway 124. Alternatively, when the switch 126 is an electrical switch, the switch 126 may be controlled to selectively electrically couple the first electrical pathway 120 to the third electrical pathway 124 and selectively electrically couple the second electrical pathway 122 to the third electrical pathway 124.

The switch 126 may have a third position in which the switch 126 is not electrically coupled to either of the first electrical pathway 120 or the second electrical pathway 122. Instead, the switch 126 is in a neutral position (see position of the switch 126 in FIG. 2) in which the switch 126 is not electrically coupled to either of the first or second electrical pathways 120, 122.

Figure 5:
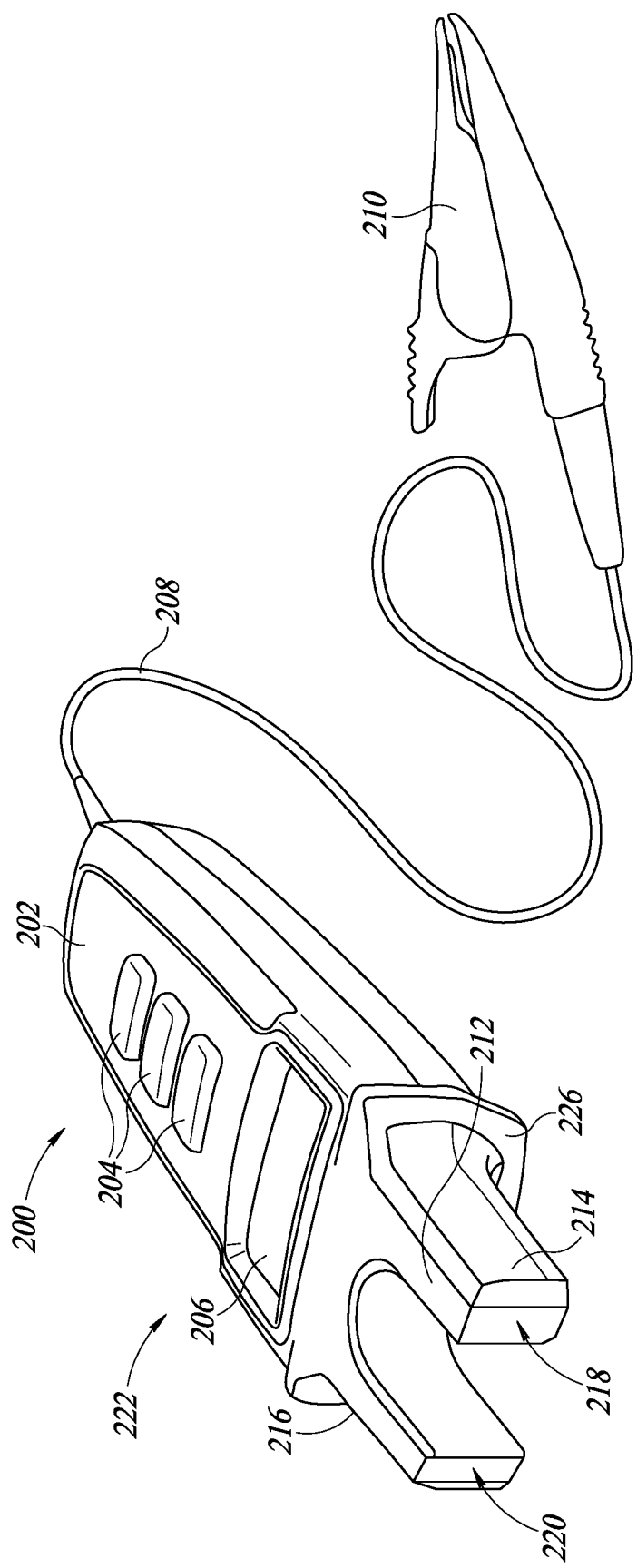
FIG. 5 is a perspective view illustrating a non-contact voltage (NCV) detector.
Figure 10:
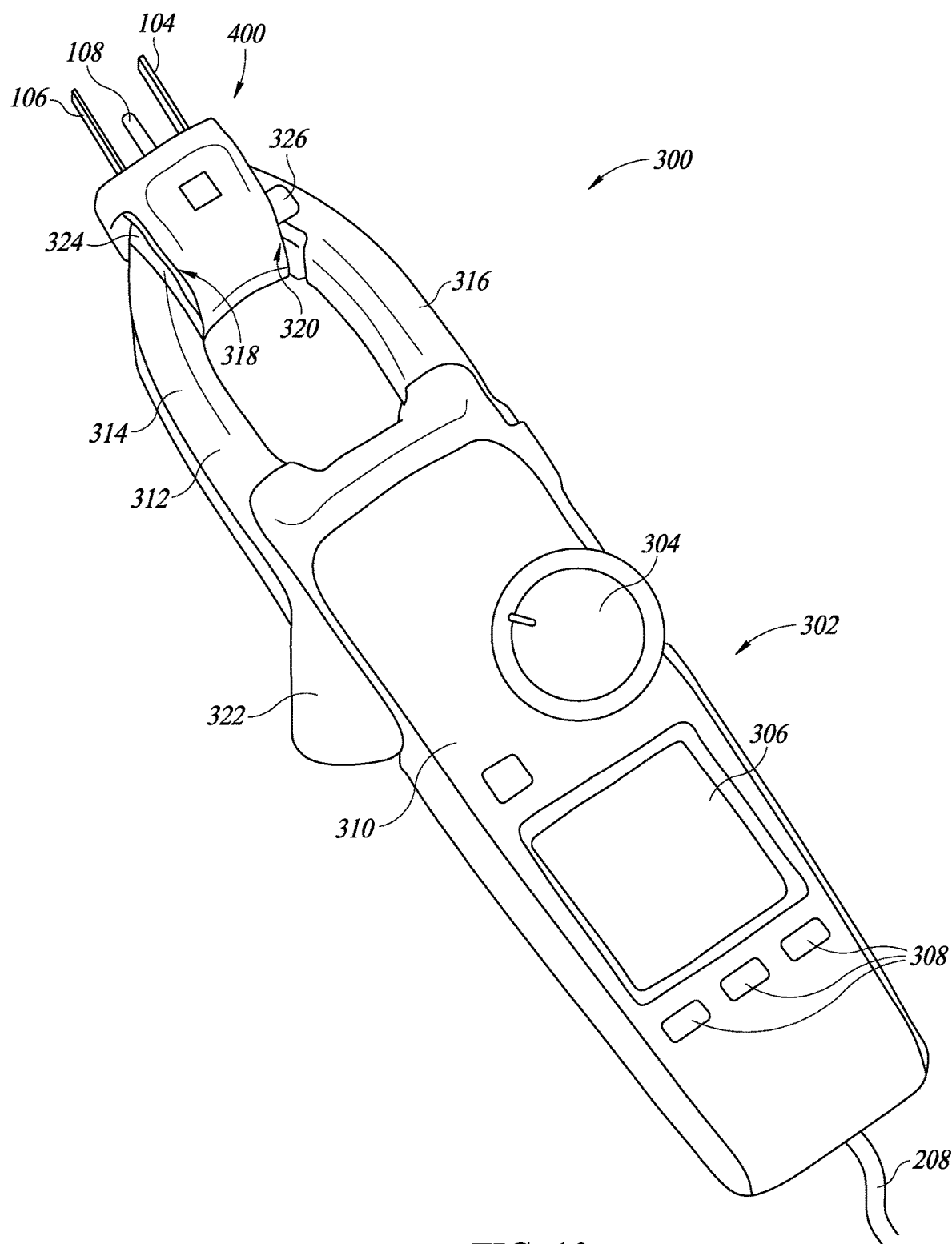
FIG. 10 is a top perspective view illustrating a system of the present disclosure including an NCV detector and an embodiment of an accessory of the present disclosure.

In some embodiments, the switch 126 is switched between being electrically coupled to the first electrical pathway 120 and the second electrical pathway 122 by an external actuator (not shown) accessible either at an external surface of the accessory 100 or at an external surface of a non-contact electrical detector (e.g., the non-contact electrical detector 200 shown in FIG. 5, the non-contact electrical detector 302 shown in FIG. 10, or some other type of non-contact electrical detector). For example, an external actuator may be magnetically coupled to the switch 126, or the external actuator may be mechanically coupled to the switch 126, such that the switch may be switched between being electrically coupled to the first electrical pathway 120 and the second electrical pathway 122. The external actuators may be actuated electronically, mechanically, by physical manipulation by a user, or by some other type of actuation.

When the switch 126 electrically couples the first electrical pathway 120 to the third electrical pathway 124, an electrical signal at the first external conductive prong 104 is transmitted through the first electrical pathway 120, the switch 126, and the third electrical pathway 124 to the internal conductive prong 114 such that the electrical signal is present at the second portion 118 of the internal conductive prong 114. Alternatively, when the switch 126 electrically couples the second electrical pathway 122 to the third electrical pathway 124, an electrical signal at the second external conductive prong 106 is transmitted through the second electrical pathway 122, the switch 126, and the third electrical pathway 124 to the internal conductive prong 114 such that the electrical signal is present at the second portion 118 of the internal conductive prong 114.

While the first, second, and third electrical pathways 120, 122, 124 may be a plurality of wires, in some embodiments, the first, second, and third electrical pathways 120, 122, 124 are portions of the switch 126. For example, the first electrical pathway 120 may be a first end of the switch 126, the second electrical pathway 122 may be a second end of the switch 126, and the third electrical pathway 124 may be a third end of the switch 126.

Figure 9:
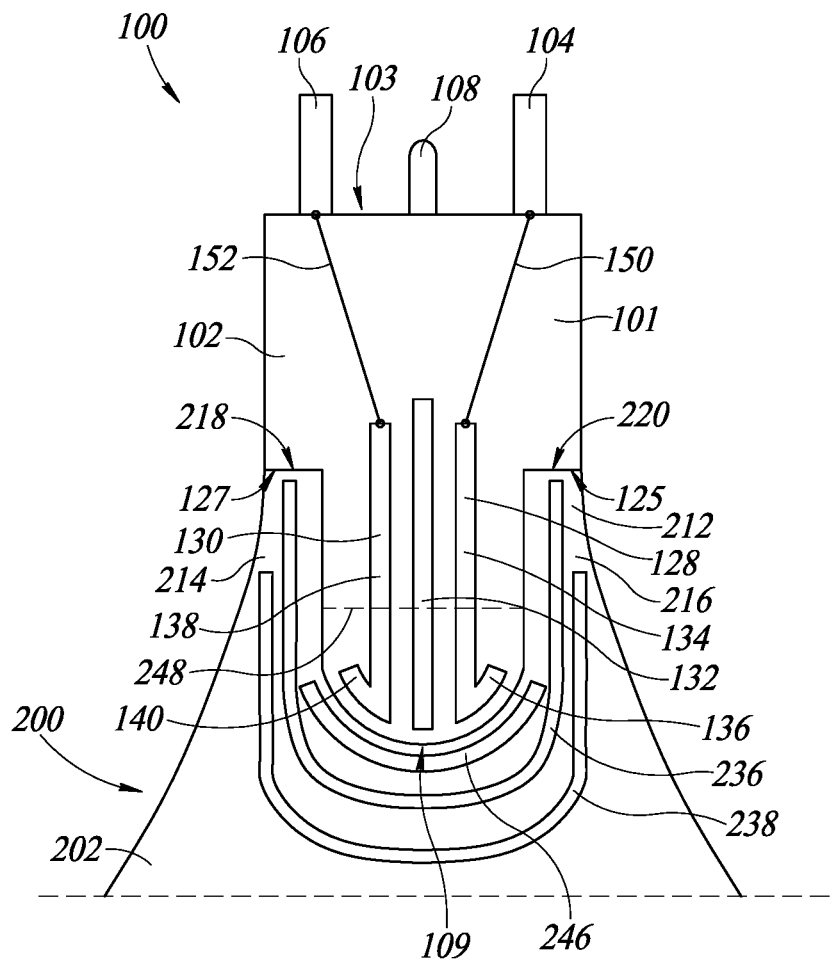
FIG. 9 is a top cross-sectional schematic diagram illustrating a portion of the system shown in FIGS. 6A and 6B including the embodiment of the accessory shown in FIG. 4.

When the switch 126 is electrically coupling the first electrical pathway 120 to the third electrical pathway 124 and the first, second, and third external conductive prongs 104, 106, 108 are inserted into the electrical outlet, a first electrical signal having a first voltage (e.g., hot receptacle voltage, hot voltage, etc.) is transmitted from the hot receptacle to the internal conductive prong 118 successively along the first external conductive prong 104, the first electrical pathway 120, the switch 126, and the third electrical pathway 124. As shown in FIG. 9, a non-contact sensor 246 of a non-contact detector 200, which may be a non-contact voltage (NCV) detector, detects the first voltage when the accessory 100 is inserted into a gap 219 of the non-contact detector 200 such that the internal conductive prong 114 is within a sensing area 234 of the non-contact sensor 232.

When the switch 126 is electrically coupling the second electrical pathway 122 to the third electrical pathway 124 and the first, second, and third external conductive prongs 104, 106, 108 are inserted into the electrical outlet, a second electrical signal having a second voltage (e.g., neutral receptacle voltage, neutral voltage, etc.) is transmitted from the neutral receptacle to the internal conductive prong 118 successively along the second external conductive prong 106, the second electrical pathway 122, the switch 126, and the third electrical pathway 124. As shown in FIG. 9, the non-contact sensor 246 of the non-contact detector 200 detects the second voltage when the accessory 100 is inserted into the gap 219 of the non-contact detector 200 such that the internal conductive prong 114 is within the sensing area 234 of the non-contact sensor 232.

An electrician may utilize the first voltage and the second voltage measured by the non-contact detector 246 to determine whether there is a defect (e.g., mis-wiring) behind the electrical outlet (e.g., within a wall at which the electrical outlet is present) without having to remove the electrical outlet from the wall. For example, the electrician may measure the first voltage and then measure the second voltage. In one situation, when the first voltage is less than 120-volts, the electrician may determine that there is a mis-wiring defect along a wire extending from a service panel (e.g., circuit breaker panel) to the hot receptacle of the outlet. In at least another situation, when the second voltage is greater than 0-volts, the electrician may determine that there is a mis-wiring defect along a wire extending from the service panel (e.g., circuit breaker panel) to the neutral receptacle. In either of these situations, the mis-wiring defect may cause issues or malfunctions when the electrical outlet is utilized. In other words, the electrician may quickly and easily determine that there is a defect in the wiring behind the electrical outlet before having to remove the electrical outlet from the wall at which the electrical outlet is present.

In another situation, the first voltage detected utilizing the accessory 100 may be 0-volts and the second voltage detected utilizing the accessory 100 may be 120-volts. This likely indicates that wiring behind the electrical outlet has been mis-wired such that the neutral receptacle is acting as a hot receptacle, and the hot receptacle is acting a neutral receptacle. In this situation, the electrician may easily repair this mis-wiring by removing the electrical outlet from the wall, switching the wires coupled to the neutral receptacle and the hot receptacle, respectively, and then reinstalling the electrical outlet into the wall. By switching the wires, the neutral receptacle will act as a neutral receptacle and the hot receptacle will act as a hot receptacle as originally intended.

In view of the above discussion, the electrician may readily utilize the accessory 100 of the present disclosure with the NCV detector 200 to collect information with respect to wiring behind an electrical outlet of interest. The electrician may easily and quickly collect information with respect to electrical characteristics of the wiring behind the electrical outlet with a low likelihood of damaging the NCV detector 200 when utilizing the accessory 100.

In some cases, the switch 126 may be replaced with a fully automatic selection structure (e.g., automatic switch) configured such that, if the second external conductive prong 106 is energized, the second electrical pathway 122 may be automatically coupled to the third electrical pathway 124, or if the first external conductive prong 104 is energized, the first electrical pathway 120 may be automatically coupled to the third electrical pathway 124. If both the first and second external conductive prongs 104, 106 are energized, one of the first or the second external conductive prongs 104, 106, respectively, may be automatically coupled to the third electrical pathway 124, and after occurrence of an event such as a predetermined period of time has elapsed or user input is received, the other of the first or second external conductive prongs 104, 106, may be automatically coupled to the third electrical pathway 124. For example, the fully automatic selection structure or configuration may include a plurality of sensors, a processor coupled to the plurality of sensors, and a plurality of electrical connections (e.g., electrical wiring, electrical traces, etc.) that automatically couple the first and second external conductive prongs, 104, 106, respectively, to the internal conductive prong 114. In some cases, the processor may be coupled to visual indicators and programmed to indicate via the visual indicators which of the first and/or second external conductive prongs 104, 106 are energized.

Figure 3:
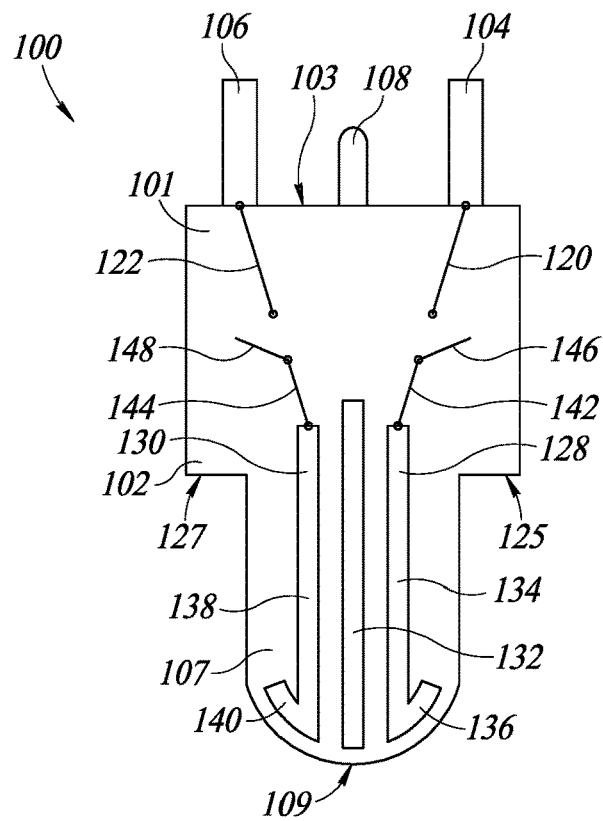
FIG. 3 is a top cross-sectional schematic diagram illustrating an embodiment of the accessory shown in FIG. 1.

FIG. 3 is a schematic diagram of a top cross-sectional view of an embodiment of the accessory 100 shown in FIG. 1. A first internal conductive prong 128 and a second internal conductive prong 130 are within the non-conductive body 101. A first electrical shield 132 within the non-conductive body 101 is positioned between the first and second internal conductive prongs 128, 130, adjacent to the second end 109 of the non-conductive body 101. The first electrical shield 132 electrically isolates the first internal conductive prong 128 from the second internal conductive prong 130 such that electrical cross-talk does not occur between the first internal conductive prong 128 and the second internal conductive prong 130.

The first internal conductive prong 128 includes a first portion 134 and a second portion 136 coupled to the first portion 134. The second portion 136 is wider than the first portion 134 and is closer to the second end 109 than the first end 103 relative to the first portion 134. The second portion 136 is adjacent to the second end 109 of the non-conductive body 101.

The second internal conductive prong 130 includes a third portion 138 and a fourth portion 140 coupled to the third portion 138. The fourth portion 140 is wider than the third portion 138 and is closer to the second end 109 than the first end 103 relative to the third portion 138.

A fourth electrical pathway 142 within the non-conductive body 101 is electrically coupled to the first internal conductive prong 128. The fourth electrical pathway 142 extends from the first internal conductive prong 128 towards the first external conductive prong 104. The fourth electrical pathway 142 may be a wire electrically coupled to the first internal conductive prong 128, a plurality of wires electrically coupled together with at least one electrically coupled to the first internal conductive prong 128, or may be some other type of electrical connection structure electrically coupled to the first internal conductive prong 128.

A fifth electrical pathway 144 within the non-conductive body 101 is electrically coupled to the second internal conductive prong 130. The fifth electrical pathway 144 extends from the second internal conductive prong 130 towards the second external conductive prong 106. The fifth electrical pathway 144 may be a wire electrically coupled to the second internal conductive prong 130, a plurality of wires electrically coupled together with at least one electrically coupled to the second internal conductive prong 130, or may be some other type of electrical connection structure electrically coupled to the second internal conductive prong 130.

A first switch 146 within the non-conductive body 101 selectively electrically couples the first electrical pathway 120 to the fourth electrical pathway 142, and a second switch 148 within the non-conductive body 101 selectively couples the second electrical pathway 122 to the fifth electrical pathway 144. The first and second switches 146, 148 may be mechanical switches, electrical switches, or a combination thereof.

The first and second switches 146, 148 may be replaced by a synchronous switch that electrically couples the first external conductive prong 104 to the first internal conductive prong 128 and the second external conductive prong 106 to the second internal conductive prong 130. In a first position, the synchronous switch may electrically isolate the first and second external conductive prongs 104, 106, respectively, from the first and second internal conductive prongs 128, 130, respectively. In a second position, the synchronous switch may bring the first and second external conductive prongs 104, 106, respectively, in electrical communication with the first and second internal conductive prongs 128, 130, respectively, through the respective electrical pathways 120, 122, 142, 144 and through the synchronous switch.

In some embodiments, the first and second switches 146, 148 are switched between being electrically coupled to the first and second electrical pathways 120, 122, respectively, and not being electrically coupled to the first and second electrical pathways 120, 122, respectively by at least one external actuator (not shown) accessible either at an external surface of the accessory 100 or at an external surface of a non-contact electrical detector (e.g., the non-contact electrical detector 200 shown in FIG. 5, the non-contact electrical detector 302 shown in FIG. 10). For example, the external switch of the non-contact electrical detector may be magnetically coupled to the switch 126, or the external actuator may be mechanically coupled to the switch 126, such that the switch may be switched between being electrically coupled to the first electrical pathway 120 and the second electrical pathway 122.

Figure 4:
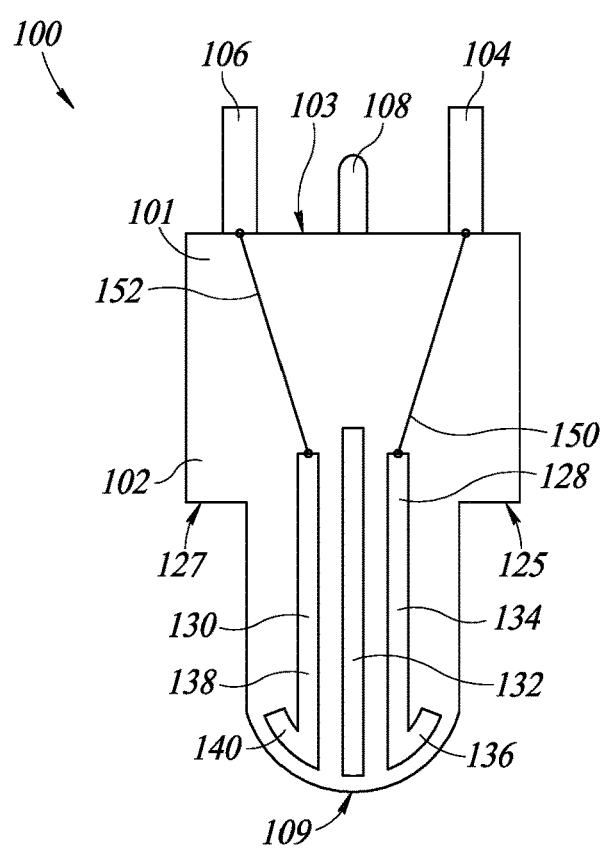
FIG. 4 is a top cross-sectional schematic diagram illustrating an embodiment of the accessory shown in FIG. 1.

FIG. 4 is directed to an embodiment of the accessory 100. Unlike the accessory 100 shown in FIG. 3, the accessory 100 shown in FIG. 4 includes a sixth electrical pathway 150 and a seventh electrical pathway 152. The sixth electrical pathway 150 electrically couples the first external conductive prong 104 to the first internal conductive prong 128, and the seventh electrical pathway 152 electrically couples the second external conductive prong 106 with the second internal conductive prong 130. The sixth electrical pathway 150 may be an electrical wire or a plurality of electrical wires that directly electrically couple the first external conductive prong 104 to the first internal conductive prong 128. The second electrical pathway 122 may be an electrical wire or a plurality of electrical wires that directly electrically couple the second external conductive prong 106 to the second internal conductive prong 130.

In some embodiments, the first external conductive prong 104 and the first internal conductive prong 128 are directly electrically coupled by being physically coupled together such that the first external conductive prong 104 and the first internal conductive prong 128 are integral to each other. For example, the first external conductive prong 104 and the first internal conductive prong 128 may be a continuous conductive structure. In some embodiments, the second external conductive prong 106 and the second internal conductive prong 130 are directly electrically coupled by being physically coupled together such that the second external conductive prong 106 and the second internal conductive prong 130 are integral to each other. For example, the second external conductive prong 106 and the second internal conductive prong 130 may be a continuous conductive structure.

As may readily be seen in FIGS. 2, 3, and 4, the first portion 102 of the non-conductive body 101 has a rectangular shape or a rectangular-like shape when viewed in a top plan view, and the second portion 107 of the non-conductive body 101 has a U-shape or a U-like shape when viewed in a top plan view.

FIG. 5 is a perspective view illustrating a non-contact electrical detector 200. In this embodiment to be discussed as follows, the non-contact electrical detector 200 is a non-contact voltage (NCV) detector 200. In some embodiments, the non-contact electrical detector 200 is a multimeter or some other type of electrical detector.

The NCV detector 200 includes a housing 202. A plurality of buttons 204 on the housing 202 provide a user interface for a user to control the NCV detector 200. For example, the user may interact with the plurality of buttons 204 to select measurements displayed on a display 206 or measured by the NCV detector 200. The display 206 may be a liquid crystal display (LCD), a digital display, or some other type of display. A wire 208 is coupled to the housing 202 and is in electrical communication with respective circuitry within the housing 202. The wire 208 is coupled to a clip 210 external to the housing 202. In use, the clip 210 may be attached to a grounded object to ground the circuitry within the NCV detector 200 electrically coupled to the wire 208.

The housing 202 of the NCV detector 200 includes a female form factor, e.g., a receiving structure 212 having a first extension 214 and a second extension 216. The first extension 214 includes a first end surface 218 and the second extension 216 includes a second end surface 220. The first and second end surfaces 218, 220, respectively, may be substantially flat ends of the first and second extensions 214, 216, respectively. In some embodiments, the receiving structure 212 is a forked structure in which the first extension 214 is a first prong or tine of the forked structure and the second extension 216 is a second prong or tine of the forked structure, with a gap 219 there between.

The gap 219 extends from the first extension 214 to the second extension 216 and separates the first extension 214 from the second extension 216. The gap 219 has a U-shape or U-like shape the same or similar to the U-shape or U-like shape of the second portion 107 of the non-conductive body 101 of the accessory 100 shown in FIGS. 2, 3, and 4. A sensing area, which may be referred to as a non-contact sensing area, of an NCV sensor within the housing 202 may extend along or across the gap 219. For example, when the user is utilizing the NCV detector 200 without the accessory 100, the user may place a wire within the gap 219 such that the wire is positioned between the first and second extensions 214, 216 in the sensing area of the NCV sensor to detect an electrical characteristic such as a voltage in the wire. The NCV sensor may be configured to detect other electrical characteristics in the wire as well such as a current or some other type of electrical characteristic.

Figure 6A:
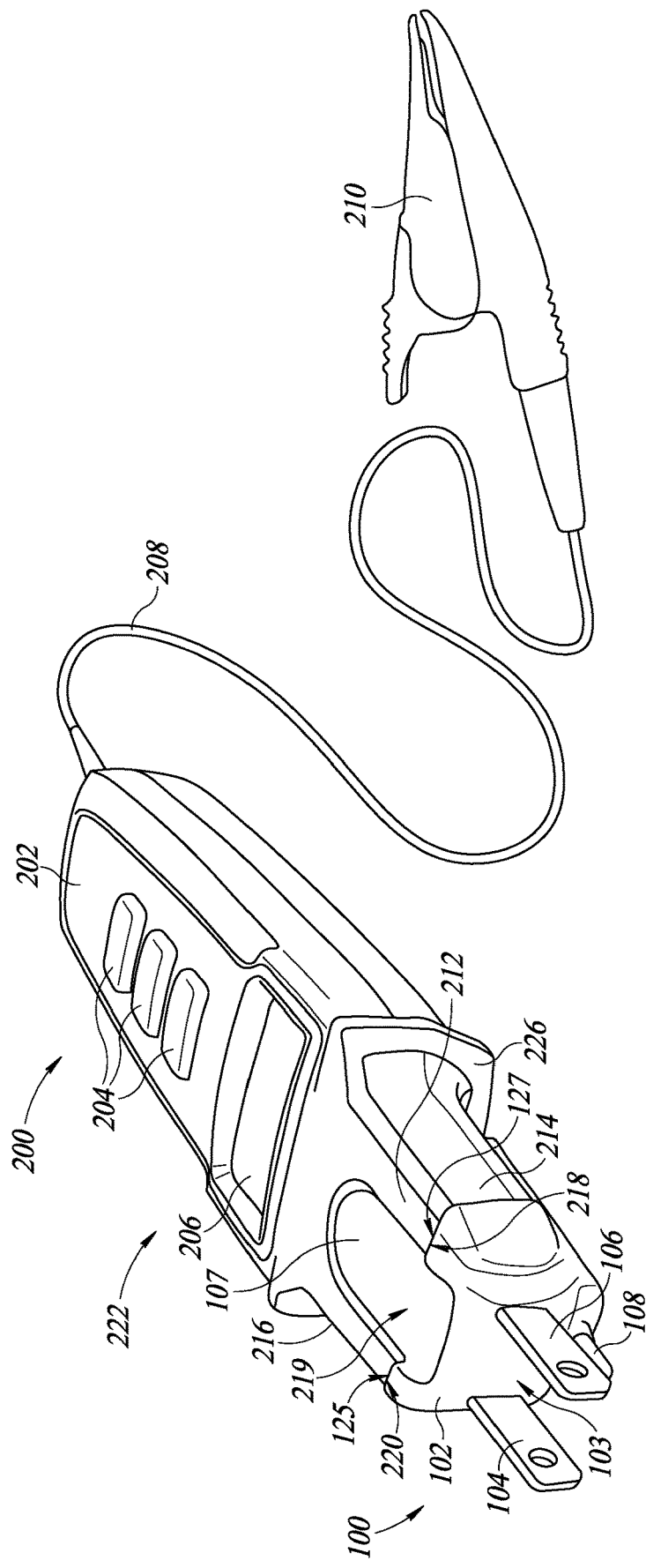
FIG. 6A is a top perspective view illustrating a system of the present disclosure in which the accessory shown in FIG. 1 is removably received by the NCV detector shown in FIG. 5.

FIG. 6A is a top perspective view illustrating a system 222 of the present disclosure in which an embodiment of the accessory 100 as shown in FIGS. 2, 3, and 4 is removably received by the receiving structure 212 of the NCV detector 200 shown in FIG. 5. As discussed earlier, the U-shape of the gap 219 shown in FIG. 5 is the same or similar to (i.e., corresponds, mimics, resembles, mirrors) the U-shape of the second portion 107 of the non-conductive body 101 shown in FIG. 2.

When a user utilizes the NCV detector 200 as shown in FIG. 5 to measure a voltage or an electrical characteristic behind an electrical outlet, the user inserts (e.g., slides) the accessory 100 into the gap 219 between the first and second extensions 214, 216 of the NCV detector 200. In this embodiment, since the accessory 100 and the gap 219 have the same or similar U-shape, the accessory 100 may be held in place by a pressure fit between the accessory 100 and the first and second extensions 214, 216 of the NCV detector 200. However, the user may later remove the accessory 100 from the NCV detector 200 by pulling the accessory 100 with enough force to overcome the pressure fit and remove the accessory 100 from the first and second extensions 214, 216. The second portion 107 of the accessory 100, the first extension 214, and the second extension 216 may be sized and shaped to direct and facilitate insertion of the accessory 100 between the first and second extensions 214, 216 in a proper orientation when utilizing the accessory 100 with the NCV detector 200.

Figure 6B:
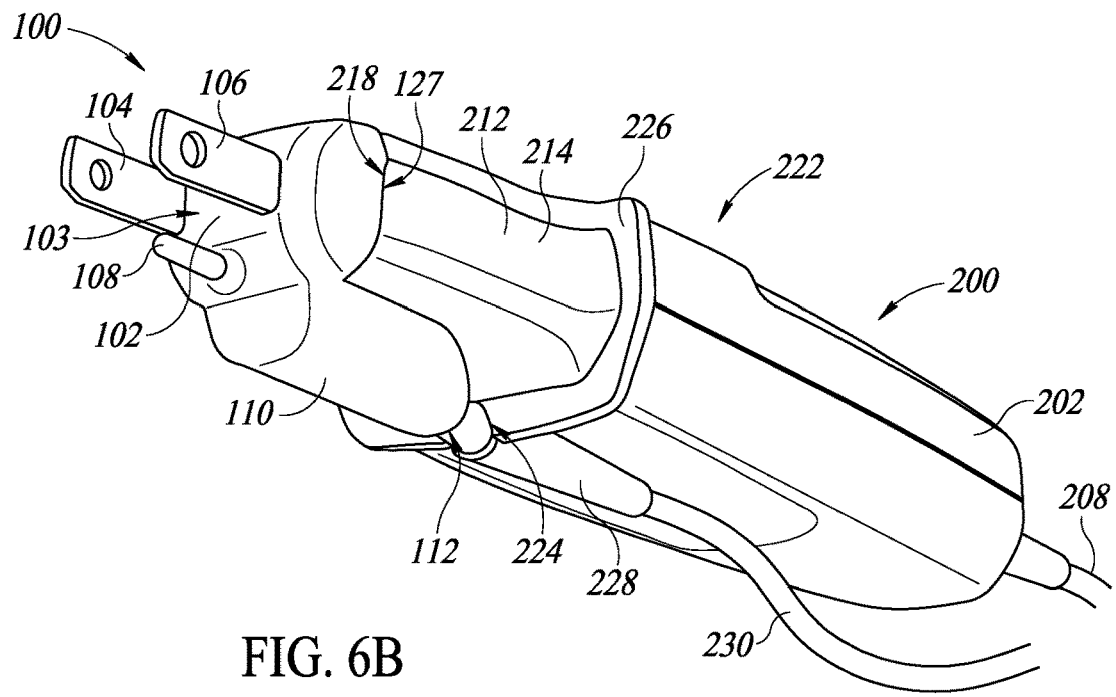
FIG. 6B is a bottom perspective view illustrating the system shown in FIG. 6A.

FIG. 6B is a bottom perspective view illustrating the system 222 as shown in FIG. 6A. The housing 202 further includes a reception structure 224 of a peripheral portion 226, which flares out from the housing 202 separating the receiving structure 212 from the plurality of buttons 204 and the display 206 of the housing 202. A male end 228 (e.g., a male component of a coaxial electrical plug), which is coupled to a wire 230, is inserted into and received by the female electrical receptacle 112 (e.g., a female component of a coaxial electrical plug) of the third portion 110 of the accessory 100. The male end 228 may be removably received by the reception structure 224 such that the male end 228 is at least partially held in place by the reception structure 224.

In some embodiments, the wire 230 is in electrical communication with the third external electrical prong 108 through circuitry present in the accessory 100 such that the accessory 100 is grounded. In some embodiments, the accessory 100 does not include the third portion 110 of the non-conductive body 101 and the accessory 100 is grounded utilizing the ground receptacle of the electrical outlet by inserting the third external conductive prong 108 into the ground receptacle. In some embodiments, the third external conductive prong 108 is in galvanic contact with an electrical contact (not shown) at an external surface of the receiving structure 212 of the NCV sensor such that the third external conductive prong 108 is grounded through circuitry in electrical communication with the wire 208 coupled to the housing 202. In some embodiments, the third external conductive prong 108 is electrically coupled to circuitry within the NCV sensor such that the third external conductive prong 108 grounds the circuitry in the NCV detector 200 and in the accessory 100. In some embodiments in which the third external conductive prong 108 is not present, the wire 230 grounds the accessory 100 with circuitry in the accessory 100 in electrical communication with the first external conductive prong 104 and/or the second external conductive prong 106 grounding the accessory 100 utilizing the wire 230.

When the accessory 100 is positioned within the receiving structure 212, the first surface 125 of the non-conductive body 101 physically abuts the second end surface 220 of the first extension 214, and the second surface 127 of the non-conductive body 101 physically abuts the first end surface 218 of the second extension 216. In other words, the first and second end surfaces 218, 220 may delimit the insertion of the second portion 107 of the non-conductive body 101 of the accessory 100 into the gap 219.

Figure 7:
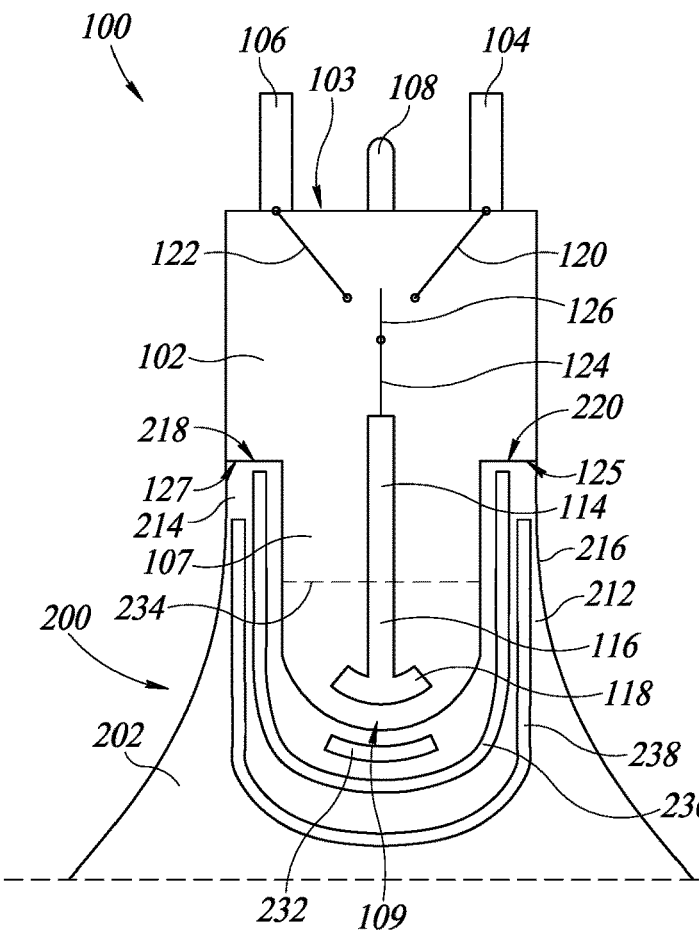
FIG. 7 is a top cross-sectional schematic diagram illustrating a portion of the system shown in FIGS. 6A and 6B including the embodiment of the accessory shown in FIG. 2.

FIG. 7 is an enlarged schematic cross-sectional diagram of the accessory 100 shown in FIG. 2 removably positioned between the first extension 214 and the second extension 216 of the NCV detector 200.

A non-contact sensor 232 within the housing 202 has a sensing area 234 in which the non-contact sensor 232 detects electrical characteristics (e.g., voltage, current, or some other type of electrical characteristic) present within the sensing area 234. The non-contact sensor 232 may be referred to as a non-contact electrical sensor. In this embodiment, the non-contact sensor 232 is a non-contact voltage (NCV) sensor 232 and the sensing area 234 is a voltage sensing area 234. When the accessory 100 is removably received by the receiving structure 212, the internal conductive prong 114 is within the voltage sensing area 234 of the NCV sensor 232. As shown in FIG. 7, the first portion 116 of the internal conductive prong 114 extends into the voltage sensing area 234 and the second portion 118 of the internal conductive prong 114 is fully within the voltage sensing area 234. The second portion 118 of the internal conductive prong 114 is positioned adjacent to the NCV sensor 232 such that the second portion 118 is closer to the NCV sensor 232 relative to the first portion 116.

A second electrical shield 236 is within the housing 202 and is positioned between a reference 238 within the housing 202 and the NCV sensor 232. The second electrical shield 236 electrically isolates the reference 238 from the NCV sensor 232 such that electrical cross-talk does not occur between the NCV sensor 232 and the reference 238. The reference 238 is utilized with the NCV sensor 232 to measure an electrical characteristic (e.g., voltage, current, etc.) within the internal conductive prong 114, e.g., as described in U.S. Pat. No. 10,352,967, which is incorporated by reference herein.

In a method of utilizing the accessory 100 with the NCV detector 200 to detect an electrical characteristic (e.g., a voltage) behind an electrical outlet, the first and second external conductive prongs 104, 106 of the accessory 100 are inserted into receptacles of an electrical outlet. For example, the first external conductive prong 104 may be inserted into a first receptacle (e.g., hot receptacle) of the electrical outlet, the second external conductive prong 106 may be inserted into a second receptacle (e.g., neutral receptacle) of the electrical outlet, and the third external conductive prong 108 may be inserted into a third receptacle (e.g., ground receptacle) of the electrical outlet. The accessory 100 may be inserted into the electrical outlet before or after being removably received by the receiving structure 212 of the accessory 100. As discussed earlier, a switch is selectively electrically coupleable to either the first electrical pathway 120 or the second electrical pathway 122.

When the switch is switched to be electrically coupled to the first electrical pathway 120, an electrical signal travels successively along the first external conductive prong 104, the first electrical pathway 120, the switch, and the third electrical pathway 124 into the internal conductive prong 114. The NCV sensor 232 then detects an electrical characteristic (e.g., voltage, current, etc.) in the internal conductive prong 114.

When the switch is electrically coupled to the second electrical pathway 122, an electrical signal travels successively along the second external conductive prong 106, the second electrical pathway 122, the switch, and the third electrical pathway 124 into the internal conductive prong 114. The NCV sensor 232 then detects an electrical characteristic (e.g., voltage, current, etc.) in the internal conductive prong 114.

Figure 8A:
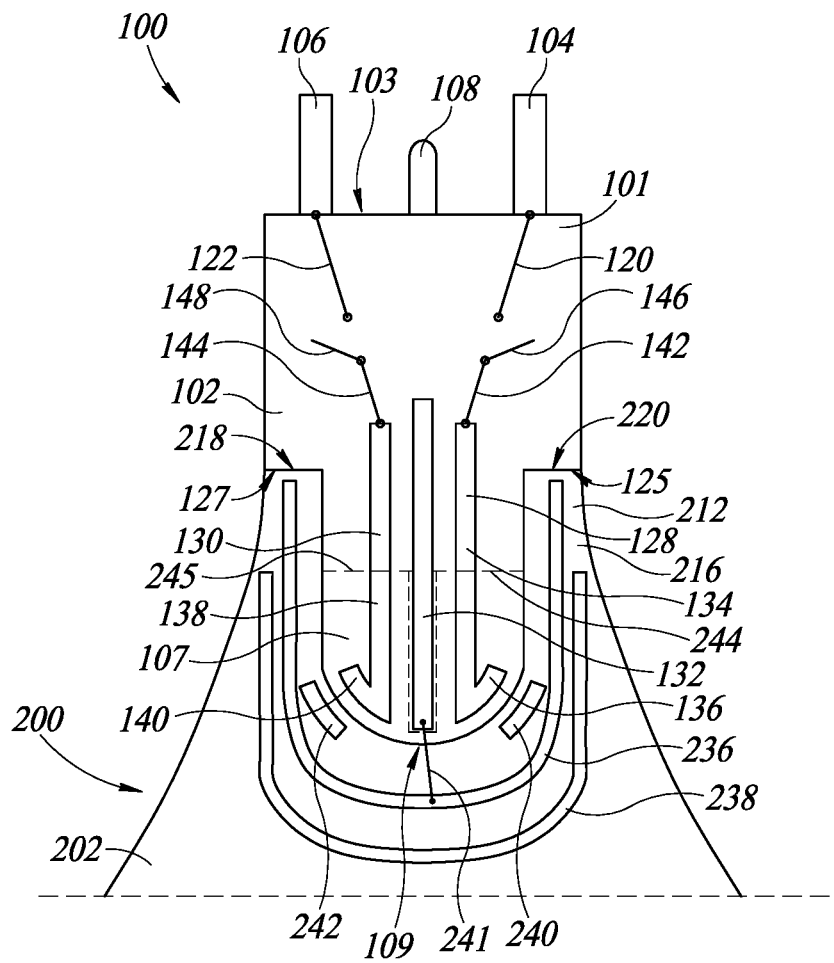
FIG. 8A is a top cross-sectional schematic diagram illustrating a portion of the system shown in FIGS. 6A and 6B including the embodiment of the accessory shown in FIG. 3.

FIG. 8A is an enlarged schematic diagram of the accessory 100 shown in FIG. 3 removably positioned between the first extension 214 and the second extension 216 of an embodiment of the NCV detector 200.

Unlike the embodiment of the NCV detector 200 shown in FIG. 7, the embodiment of the NCV detector 200 shown in FIG. 8A includes a first non-contact sensor 240 and a second non-contact sensor 242 that are within the housing 202. The first non-contact sensor 240 has a first sensing area 244 and the second non-contact sensor 242 has a second sensing area 245. In this embodiment, the first and second non-contact sensors 240, 242 are NCV sensors 240, 242, and the first and second sensing areas 244, 245 are voltage sensing areas 244, 245. The first portion 134 of the first internal conductive prong 128 extends into the first voltage sensing area 244, and the second portion 136 of the first internal conductive prong 128 is fully within the first voltage sensing area 244. The third portion 138 of the second internal conductive prong 130 extends into the second voltage sensing area 245, and the fourth portion 140 of the first internal conductive prong 128 is fully within the first voltage sensing area 244.

In some embodiments, the first switch 147 and the second switch 138 are not present. For example, the first and third electrical pathways 120, 142 are directly coupled to each other such that a respective electrical pathway extends from the first internal conductive prong 128 to the first external conductive prong 104, and the second and fourth electrical pathways 122, 144 are directly coupled to each other such that a respective electrical pathway extends from the second internal conductive prong 130 to the second external conductive prong 106.

In a method of utilizing the accessory 100 with the NCV detector 200 of FIG. 8A to detect a voltage behind an electrical outlet, the first, second, and third external conductive prongs 104, 106, 108 of the accessory 100 are inserted into corresponding receptacles of an electrical outlet in the same or similar fashion as discussed earlier with respect to FIG. 7. The first switch 146 is selectively electrically coupleable to the first electrical pathway 120 and the second switch 148 is selectively electrically coupleable to the second electrical pathway 122.

When the first switch 146 is switched to be electrically coupled to the first electrical pathway 120, an electrical signal travels successively along the first external conductive prong 104, the first electrical pathway 120, the first switch 146, and the fourth electrical pathway 142 into the first internal conductive prong 128. The first NCV sensor 240 then detects an electrical characteristic (e.g., voltage, current, etc.) in the first internal conductive prong 128.

When the second switch 148 is switched to be electrically coupled to the second electrical pathway 122, an electrical signal travels successively along the second external conductive prong 106, the second electrical pathway 122, the second switch 148, and the fifth electrical pathway 144 into the second internal conductive prong 130. The second NCV sensor 242 then detects an electrical characteristic (e.g., voltage, current, etc.) in the second internal conductive prong 130.

In some cases, the first electrical shield 132 of the accessory 100 is electrically coupled to the second electrical shield 236 by an electrical pathway 241. The first electrical shield 132 and the second electrical shield 236 are grounded such that the first electrical shield 132 electrically isolates the first internal conductive prong 128 from the second internal conductive prong 130. In some cases, a portion of the first electrical shield 132 protrudes outward from the second end 109 of the second portion of the non-conductive body 101 and may be inserted into an electrical receptacle present at a surface of the NCV detector 200 delimiting the gap 219. The portion of the first electrical shield 132 may be inserted into the electrical receptacle such that the first electrical shield 132 is electrically coupled to the second electrical shield 236 resulting in the first electrical shield 132 being grounded along with the second electrical shield 236. In some cases, the first electrical shield 132 is grounded by the wire 230 in which the male end 228 is inserted into the female electrical receptacle 112 of the accessory 100 such that the wire 230 is electrically coupled to the first electrical shield 132 and grounds the first electrical shield 132. In some cases, the first electrical shield 132 is electrically coupled to the second electrical shield 236 by a capacitive electrical coupling. In some cases, the first electrical shield 132 is grounded via an electrical coupling to an external conductive prong (e.g., the third external conductive prong 108) that is inserted into a ground receptacle of an outlet. The grounding of the first electrical shield 132 electrically isolates the first internal conductive prong 128 from the second internal conductive prong 130.

Figure 8B:
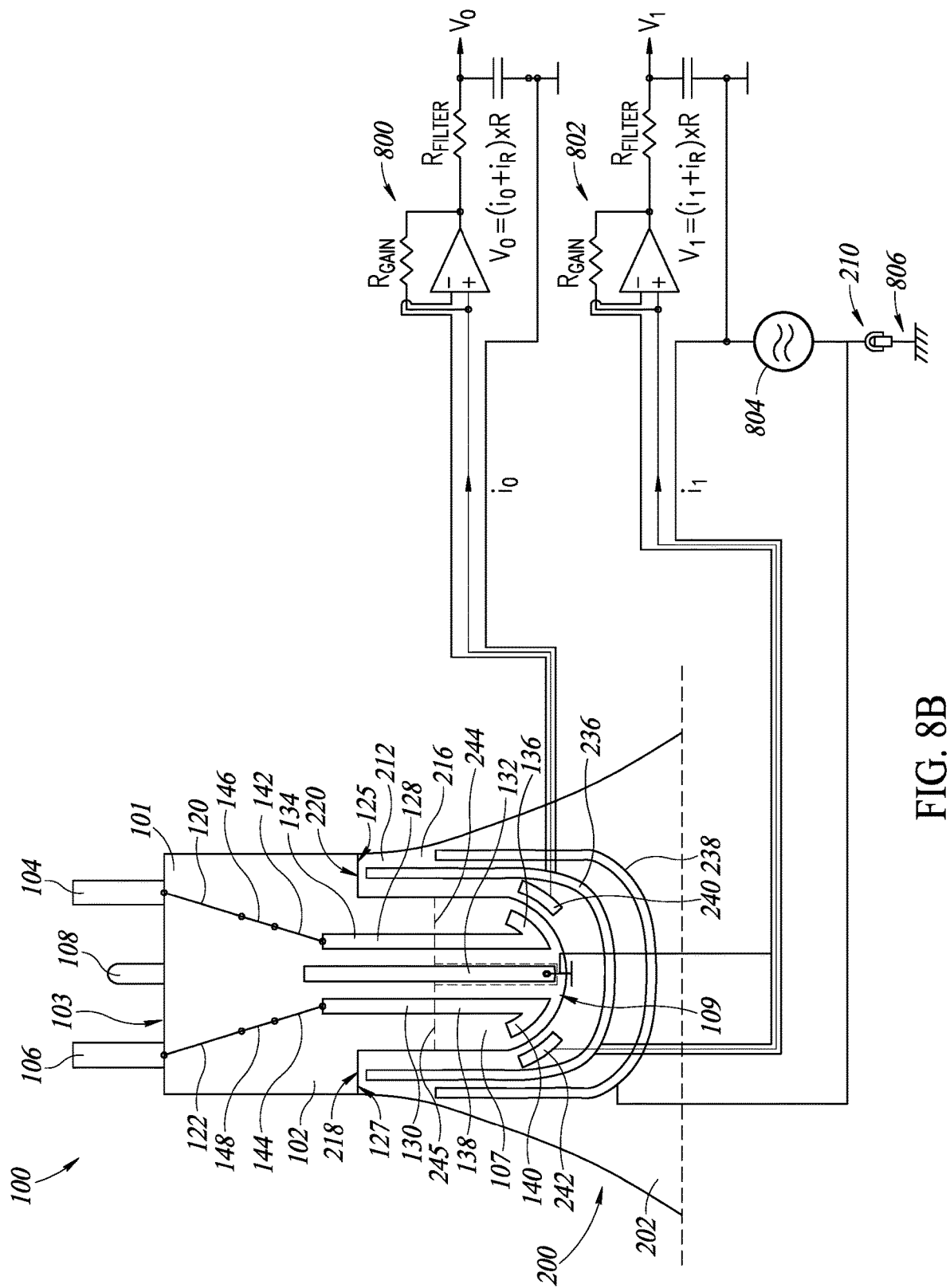
FIG. 8B is a top-cross-sectional schematic diagram including circuit elements of the NCV detector shown in FIG. 5.

FIG. 8B is a schematic diagram illustrating additional circuit components of the accessory 100 and the NCV detector 200. For example, in some embodiments, the NCV detector 200 includes a first transimpedance amplifier 800 and a second transimpedance amplifier 802. The first and second transimpedance amplifiers 800, 802, respectively, each include a gain resistor ($R_{gain}$) and a filter resistor ($R_{filter}$) The first transimpedance amplifier 800 is coupled to the first NCV sensor 240 and the second electrical shield 236. The second transimpedance amplifier 802 is coupled to second NCV sensor 242 and the second electrical shield 236. The reference 238 is coupled to the clip 210, and the clip is coupled to a test load reference potential 806, which is grounded. A voltage source 804 is coupled to the reference 238, the test load reference potential 806, and the second electrical shield 236. When the switches 146, 148 are closed forming electrical pathways between the first and second external conductive prongs 104, 106, and the respective internal conductive prongs 128, 130, the first transimpedance amplifier 800 outputs a voltage $V_0$ indicative of the voltage present within the first internal conductive prong 128, and the second impedance amplifier 802 outputs a voltage $V_1$ indicative of the voltage present within the second conductive prong 130. A first current $i_0$ is communicated from the first non-contact sensor 240 to the first transimpedance amplifier 800, and a second current $i_1$ is communicated from the second non-contact sensor 242 to the second transimpedance amplifier 802.

FIG. 9 is an enlarged in schematic diagram of the accessory 100 shown in FIG. 4 removably positioned between the first extension 214 and the second extension 216 of an embodiment of the NCV detector 200.

Unlike the embodiment of the NCV detector 200 shown in FIG. 8A, the embodiment of the NCV detector 200 shown in FIG. 9 includes a non-contact sensor 246 that detects electrical characteristics of both the first and second internal conductive prongs 128, 130 of the accessory 100. The non-contact sensor 246 includes a sensing area 248. In this embodiment, the non-contact sensor 246 is an NCV sensor 246, and the sensing area 248 is a voltage sensing area 248. The first portion 134 of the first internal conductive prong 128 and the third portion 138 of the second internal conductive prong 130 extend into the voltage sensing area 248 of the NCV sensor 246. The second portion 136 of the first internal conductive prong 128 and the fourth portion 140 of the second internal conductive prong 130 are fully within the voltage sensing area 248.

In a method of utilizing the accessory 100 with the NCV detector 200 to detect a voltage behind an electrical outlet, the first, second, and third external conductive prongs 104, 106, 108 of the accessory 100 are inserted into corresponding receptacles of an electrical outlet in the same or similar fashion as discussed earlier with respect to FIG. 8A.

An electrical signal travels successively along the first external conductive prong 104 and the sixth electrical pathway 150 into the first internal conductive prong 128. An electrical signal travels successively along the second external conductive prong 106 and the seventh electrical pathway 152 into the second internal conductive prong 130. The NCV sensor 246 then detects electrical characteristics (e.g., voltage, current, etc.) in both of the first and second internal conductive prongs 128, 130. In some embodiments, the non-contact sensor 246 is replaced by a plurality of sensors (e.g., two, three, four, etc.). For example, the plurality of sensors may be the same or similar to the first and second non-contact sensors 240, 242 as discussed earlier with respect to FIG. 8A.

In the embodiment shown in FIG. 9, the first electrical shield 132 may be grounded by the wire 230 in which the male end 228 is inserted into the female electrical receptacle 112 of the accessory 100. The grounding of the first electrical shield 132 electrically isolates the first internal conductive prong 128 from the second internal conductive prong 130.

FIG. 10 is directed to a system 300 including an embodiment of a non-contact electrical detector 302 and an embodiment of an accessory 400 of the present disclosure. In this embodiment, the non-contact electrical detector 302 is an NCV detector 302. In some embodiments, the non-contact electrical detector 302 is a multimeter or some other type of non-contact electrical detector.

The NCV detector 302 includes a knob 304, a display 306, and a plurality of buttons 308 in a housing 310 of the NCV detector 302. The knob 304, the display 306, and the plurality of buttons 308 provide a user interface for a user to control the NCV detector 302. For example, the user may interact with the knob 304 and the plurality of buttons 308 to select measurements displayed on the display 306 or measured by the NCV detector 302. The display 306 may be a liquid crystal display (LCD), a digital display, or some other type of display.

A clamp 312 is in mechanical cooperation with the housing 310. The clamp 312 includes a first clamp arm 314 and a second clamp arm 316 that extend away from the housing 310. The first clamp arm 314 has a first end 318 and the second clamp arm 316 includes a second end 320. In some embodiments, the first clamp arm 314 is biased towards second clamp arm 316, or vice versa, by a spring (not shown). In some embodiments, the first and second clamp arms 314, 316 are both biased toward each other by a spring or a plurality of springs.

A protrusion 322 of the first clamp arm 314 adjacent to the housing 310 provides an actuation structure that allows for the first clamp arm 314 to be moved or rotated away from the second clamp arm 316 when a force is applied to the protrusion 322 that overcomes a biasing force of the spring acting on the first clamp arm 314. For example, by actuating (e.g., moving or rotating) the first clamp arm 314 away from the second clamp arm 316, the accessory 400 may be positioned between respective ends 318, 320 of the first and second clamp arms 314, 316. Once the accessory 400 is positioned between the respective ends of the first and second clamp arms 314, 316, the user releases the protrusion 322 so the first clamp arm 314 actuates towards the second clamp arm 316 such that the accessory 400 is removably clamped or held between the respective ends 318, 320 of the first and second clamp arms 314, 316 by the biasing force of the spring.

A first non-contact sensor 324 at the first end 318 of the first clamp arm 314 is configured to detect electrical characteristics present within a non-conductive body 402 of the accessory 400. The non-conductive body 402 may be made of an electrically non-conductive material similar to or the same as the material used to make the non-conductive body 101 described earlier. A second non-contact sensor 326 is at the second end 320 of the second clamp arm 316. In this embodiment, the first and second non-contact 324, 326 sensors are NCV sensors 324, 326. In some embodiments, only one of the first or second NCV sensors 324, 326, respectively, is present at only one of the respective ends of the first and second clamp arms 314, 316, respectively. In some embodiments, the first non-contact sensor may be an NCV sensor, and the second sensor may be some other type of sensor for detecting another type of electrical characteristic different from the first non-contact sensor.

Figure 11A:
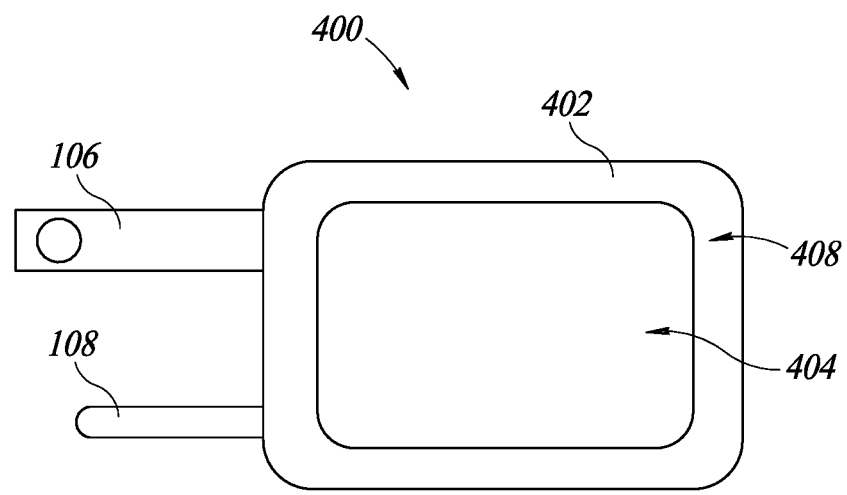
FIG. 11A is a left side view illustrating the embodiment of the accessory shown in FIG. 10.
Figure 11B:
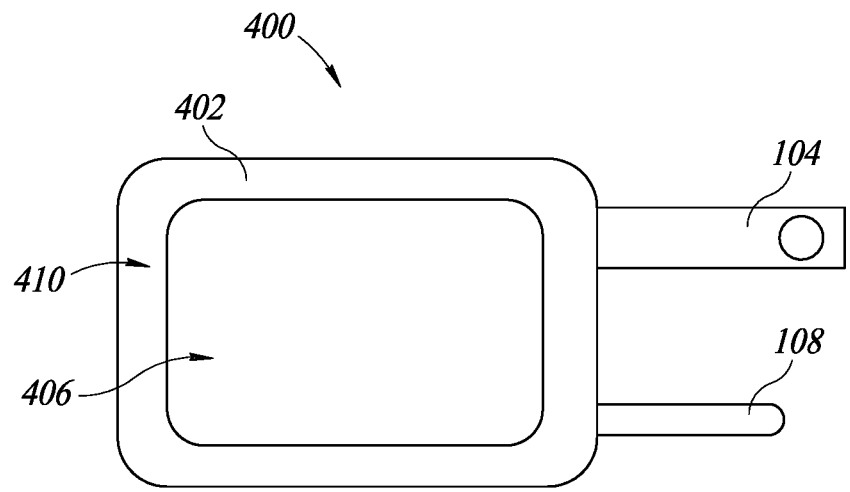
FIG. 11B is a right side view illustrating the embodiment of the accessory shown in FIG. 10.

FIGS. 11A and 11B are directed to left and right side views of the embodiment of the accessory 400 as shown in FIG. 10. In this embodiment, the accessory 400 has a cuboid shape with rounded edges.

A first recess or indentation 404 extends into the non-conductive body 402 of the accessory 400 at the left side of the accessory 400, and a second recess or indentation 406 extends into the non-conductive body 402 of the accessory 400 at the right side of the accessory 400. The first and second recesses 404, 406 are sized and shaped to receive the first and second ends 318, 320 of the first and second clamp arms 314, 316, respectively. The first end 318 may be received by the first recess 404 such that the first end 318 is inset within the first recess 404. Likewise, the second end 320 may be received by the second recess 406 such that the second end 320 is inset within the second recess 406. The first and second ends 318, 320, respectively, being inset within the first and second recesses 404, 406, respectively, allows for the first and second clamp arms 314, 316 to securely and removably hold the accessory 400.

A first raised portion 408 surrounding the first recess 404 acts as boundary around the first recess 404. When the first end 318 of the first clamp arm 314 is inserted into the first recess 404, the first end 318 interlocks with the first raised portion 408 to assist in holding the accessory 400 in a stationary position when the accessory 400 is held between the first and second clamp arms 314, 316.

Similarly, a second raised portion 410 surrounding the second recess 406 acts as a boundary around the second recess 406. When the second end 320 of the second clamp arm 316 is inserted into the second recess 406, the second end 320 interlocks with the second raised portion 410 to assist in holding the accessory 400 in a stationary position when the accessory 400 is held between the first and second clamp arms 314, 316.

The internal features of the accessory 400 may be the same or similar to the internal features discussed earlier with respect to the embodiments of the accessory 100 in FIGS. 1-4 of the present disclosure. The internal features may be slightly reorganized or structured slightly differently so that the accessory 400 more readily brings an electrical signal within a voltage sensing area of the first and second non-contact sensors 324, 326 of the first and second clamp arms 314, 316. It will be readily appreciated that the accessory 400 interacts with the first and second non-contact sensors 324, 326 at the respective ends of the first and second clamp arms 314, 316, respectively, in the same or similar manner as the embodiments of the accessory 100 interact with the non-contact sensor(s) 232, 240, 242, 246 in the embodiments of the non-contact electrical detector 200 shown in FIGS. 6A, 6B, 7, 8, and 9 of the present disclosure.

Figure 12:
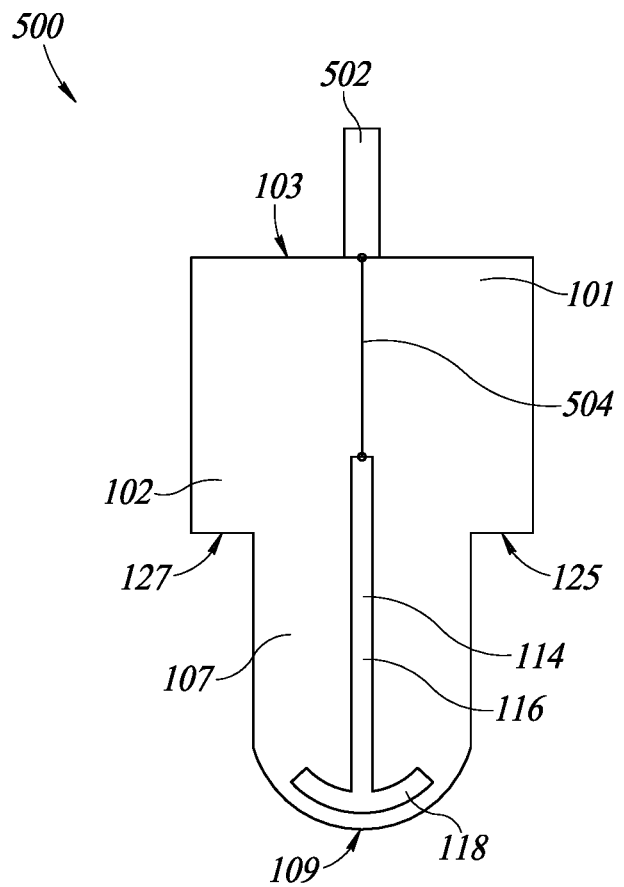
FIG. 12 is a top cross-sectional schematic diagram illustrating an embodiment of the accessory of the present disclosure.

FIG. 12 illustrates an embodiment of an accessory 500 including an external conductive prong 502 extending outward from the non-conductive body 101. The external conductive prong 502 may be the same or similar as the first, second, or third external conductive prongs 104, 106, 108 as discussed earlier with respect to the accessory 100 shown in FIG. 2. The external conductive prong 502 is directly electrically coupled to the internal conductive prong 114 by an electrical pathway 504, which may be an electrical wire or a plurality of electrical wires electrically coupling the external conductive prong 502 to the internal conductive prong 114. The external conductive prong 502 may be inserted into a receptacle (e.g., hot, neutral, ground, or some other type of receptacle) of an electrical outlet. In some embodiments, a switch along the electrical pathway selectively electrically couples the external conductive prong 502 to the internal conductive prong 114. It will be readily appreciated that the accessory 500 may be utilized with the embodiments of the NCV detectors 200 as discussed earlier for detecting electrical characteristics of an electrical line or circuit at or behind an electrical outlet.

While not shown, the embodiments of the accessory 100 as shown in FIGS. 1-4 and the embodiment of the accessory 400 as shown in FIGS. 10, 11A, and 11B may be adapted and constructed to include a single external conductive prong similar to the external conductive prong 502 as shown in FIG. 12.

Figure 13:
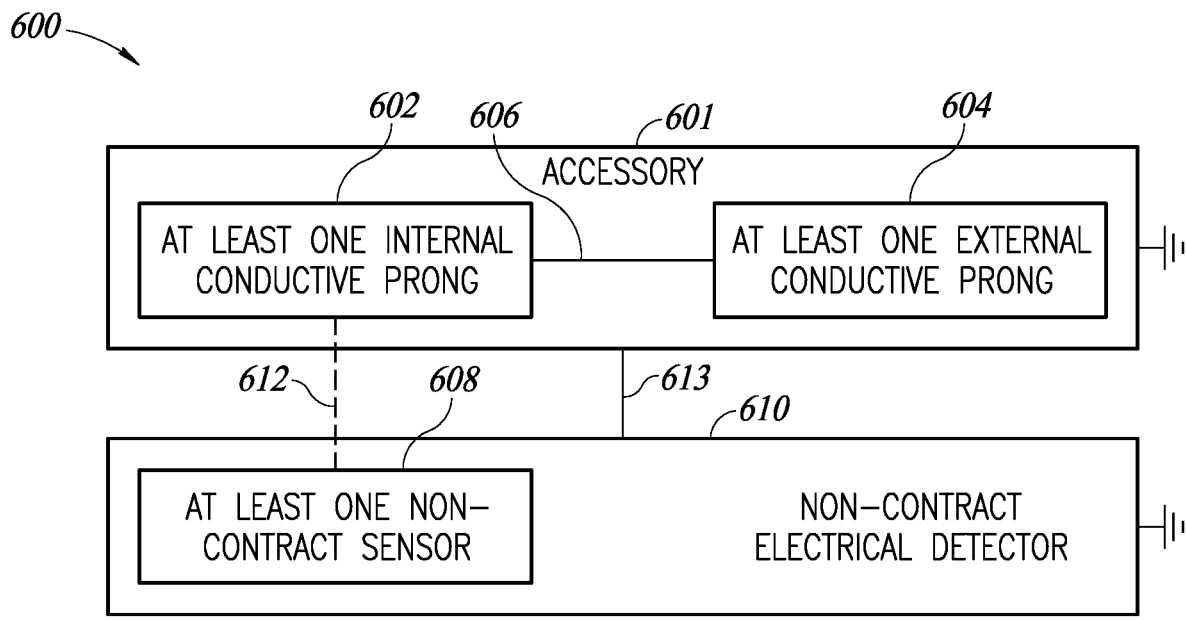
FIG. 13 is a block diagram illustrating an embodiment of the accessory of the present disclosure.

FIG. 13 is a block diagram illustrating a system 600 of the present disclosure. The system 600 includes an accessory 601 including at least one internal conductive prong 602 electrically coupled, or selectively electrically coupleable, with the at least one external conductive prong 604 by an electrical pathway 606. The at least one internal conductive prong 602 is positioned within a sensing area of at least one non-contact sensor 608 in a non-contact electrical detector 610, allowing the non-contact electrical detector 610 to detect an electrical characteristic of an electric signal in the at least one internal conductive prong 602 without galvanic contact between the at least one internal conductive prong 602 and the at least one non-contact sensor 608, as represented by a dotted line 612.

The non-contact electrical detector 610 and preferably the accessory 601 are both grounded. In some cases, the accessory 601 is grounded via an external conductive prong (not shown) that is inserted into a ground receptacle of an outlet. In some cases, the accessory 601 is galvanically coupled by an electrical connection 613 to the non-contact electrical detector 610, e.g., by way of a wire that extends between the accessory 601 and the non-contact electrical detector 610. In some cases, the accessory 100 includes a conductive protrusion that is received by a receptacle of the non-contact electrical detector 610 which galvanically couples the accessory 601 to the non-contact electrical detector 610. The non-contact electrical detector 610 may be grounded via an wire coupled to an external clip (e.g., wire 208 and clip 210 as described earlier) that, in use, is attached to a grounded object.

The at least one internal conductive prong 602 may be one of the respective internal conductive prongs 114, 128, 130 as discussed earlier herein. The at least one external conductive prong 604 may be one of the respective external conductive prongs 104, 106, 108, 502 as discussed earlier herein. The at least one non-contact sensor 608 may be one of the respective non-contact sensors 232, 240, 242, 246 as discussed earlier herein. The accessory 601 may be one of the respective embodiments of the accessories 100, 400, 500 as discussed earlier herein. The non-contact electrical detector 610 may be one of the respective non-contact electrical detectors 200, 302 as discussed earlier herein. Lastly, the system 600 may be one of the respective systems 222, 300 as discussed earlier herein.

Figure 14:
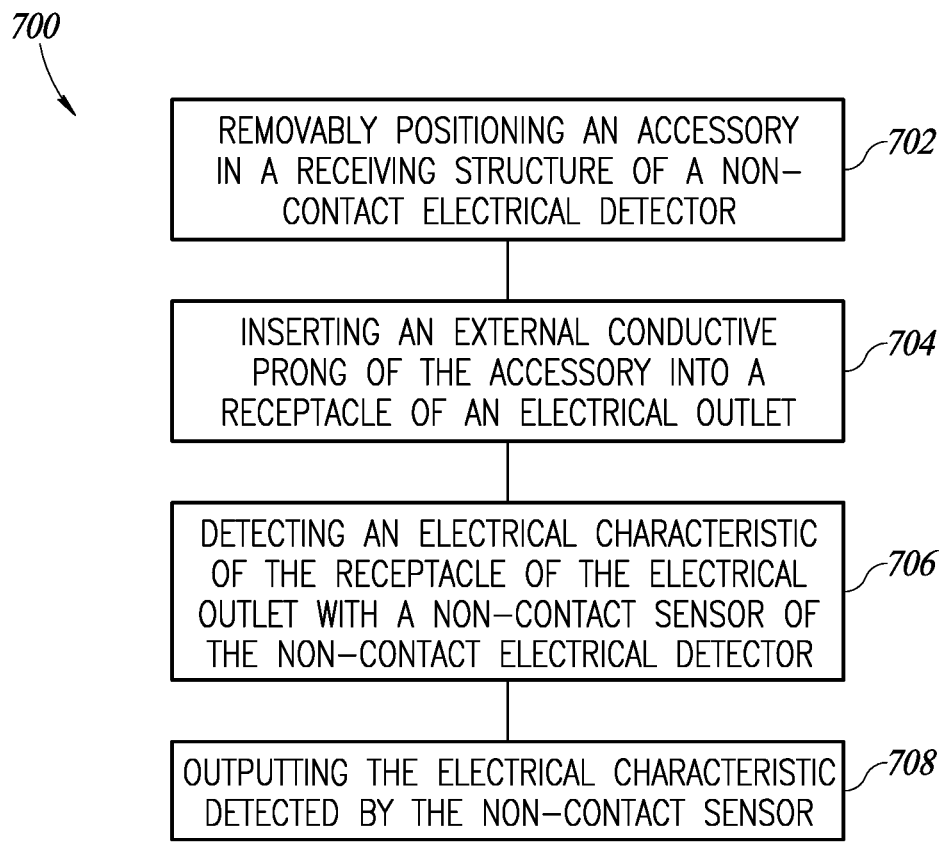
FIG. 14 is a flow diagram illustrating a method of utilizing the accessory of the present disclosure.

FIG. 14 is a flowchart 700 illustrating a method of utilizing embodiments of the accessories and non-contact electrical detectors of the present disclosure.

In a step 702, the accessory is removably positioned in a form factor (e.g., receiving structure) of a non-contact electrical detector. The receiving structure may be the female receiving structure 212 as shown in FIGS. 6A and 6B, or the receiving structure may be the clamp as shown in FIG. 10. In step 704, an external conductive prong of the accessory is inserted into an electrical outlet. Inserting the external conductive prong into the receptacle electrically couples the accessory to an electrical line or circuit at or behind the electrical outlet. After the external conductive prong is inserted into the receptacle of the electrical outlet, in step 706, an electrical signal in the electrical line or circuit is transmitted through the external conductive prong into the accessory and an electrical characteristic of the electrical signal in the accessory is detected by a non-contact sensor of the non-contact electrical detector. For example, the non-contact sensor may detect the electrical characteristic in an internal conductive prong within the accessory that is electrically coupled to the external conductive prong. After the electrical characteristic is detected, in step 708, the electrical characteristic detected is output by the non-contact electrical detector. For example, a measurement signal or a detection signal may be sent to a display of the non-contact electrical detector that outputs the measurement signal or the detection signal to a user in a readable form. Alternatively, the measurement signal or the detection signal may be sent to an external electronic device in communication with the non-contact electrical detector such as a memory, an external display, or some other external electronic device.

It will be readily appreciated that the first step 702 and the second step 704 may be reordered such that the first step occurs after the second step. For example, the external conductive prong may be inserted into the receptacle of the electrical outlet, and after insertion, the non-contact electrical detector removably receives the accessory.

In view of the foregoing disclosure, various examples of the disclosed device, systems, or methods may include any one or combination of the following features.

These features may include an accessory including a non-conductive body selectively positionable in a form factor of a non-contact electrical detector, the form factor configured to removably receive the non-conductive body. An internal conductive prong within the non-conductive body, and an external conductive prong that extends outward from the non-conductive body. The external conductive prong is electrically coupled, or selectively electrically coupleable, with the internal conductive prong, the external conductive prong configured to be inserted into a receptacle of an electrical outlet to electrically couple the external conductive prong to the first receptacle of the electrical outlet.

The external conductive prong may be a first external conductive prong, and the accessory may further include a second external conductive prong that extends outward from the non-conductive body. The second external conductive prong is configured to be inserted into a second receptacle of the electrical outlet to electrically couple the second external conductive prong to the second receptacle of the electrical outlet.

The internal conductive prong may be a first internal conductive prong, and the accessory may further include a second internal conductive prong within the non-conductive body. The first internal conductive prong is electrically coupled to the first external conductive prong. The second internal conductive prong is electrically coupled to the second external conductive prong. The first internal conductive prong may be electrically coupled to the first external conductive prong by at least a first electrical wire. The second internal conductive prong may be electrically coupled to the second external conductive prong by at least a second electrical wire.

The accessory may further include a third external conductive prong extending outward from the non-conductive body, wherein the third external conductive prong is configured to be inserted into a third receptacle of the electrical outlet to electrically couple the third external conductive prong to the third receptacle of the electrical outlet.

The external conductive prong may be a first external conductive prong, and the accessory may further include a second external conductive prong and a switch. The second external conductive prong extends outward from the non-conductive body, wherein the second external conductive prong is selectively electrically coupleable with the internal conductive prong, and the second external conductive prong is electrically isolated from the first external conductive prong. The switch selectively electrically couples the first external conductive prong and the second external conductive prong to the internal conductive prong. The switch having a first position that electrically couples the first external conductive prong to the internal conductive prong while the second external conductive prong is decoupled from the internal conductive prong. The switch having a second position that electrically couples the second external conductive prong to internal conductive prong while the first external conductive prong is decoupled from the internal conductive prong.

In use, the non-conductive body of the accessory may position the internal conductive prong within a sensing area of a non-contact electrical sensor of the non-contact electrical detector without galvanically contacting the non-contact electrical sensor.

These features may include a system including a non-contact electrical detector including a housing and a non-contact electrical sensor, and an accessory configured to be positionable in a form factor of the non-contact electrical detector that is configured to receive the accessory. The accessory including a non-conductive body configured to be removably inserted into the form factor of the non-contact electrical detector, an internal conductive prong positioned within the non-conductive body, and an external conductive prong that extends outward from the non-conductive body, the external conductive prong being electrically coupled, or selectively electrically coupleable, with the internal conductive prong.

The external conductive prong may be configured to be inserted into a receptacle of an electrical outlet to electrically couple the external conductive prong to the receptacle of the electrical outlet.

The external conductive prong is a first external conductive prong, and the accessory may further include a second external conductive prong extending outward from the non-conductive body.

The first external conductive prong may be configured to be inserted into a first receptacle of an electrical outlet to electrically couple the first external conductive prong to the first receptacle of the electrical outlet. The second external conductive prong may be configured to be inserted into a second receptacle of the electrical outlet to electrically couple the second external conductive prong to the second receptacle of the electrical outlet.

The non-contact electrical detector may further include a receiving structure integral with the housing, the receiving structure having the form factor configured to removably receive the accessory. The receiving structure including a first extension of the housing, a second extension of the housing, and a gap between the first extension and the second extension, the accessory being removably positionable within the gap between the first and second extensions, wherein the first extension, the second extension, and the gap delimit the form factor of the receiving structure configured to receive the accessory. The non-contact electrical sensor may be positioned within the housing proximate to the gap such that a sensing area of the non-contact electrical sensor extends into the gap to detect an electrical characteristic of the internal conductive prong within the accessory when the accessory is positioned within the gap of the receiving structure.

The non-contact electrical detector may further include a clamp having the form factor configured to removably receive the accessory, the clamp being in mechanical cooperation with the housing of the non-contact electrical detector. The clamp including a first clamp arm extending outward from the housing and having a first end, and a second clamp arm extending outward from the housing and having a second end, the first end of the first clamp arm being biased toward the second end of the second clamp arm to removably clamp the accessory. The non-contact electrical sensor may be positioned proximate the first end of the first clamp arm or the second end of the second clamp arm to detect an electrical characteristic of the internal conductive prong within the accessory.

The non-contact electrical sensor may be a non-contact voltage (NCV) sensor configured to detect a voltage.

The external conductive prong may be a first external conductive prong, and the accessory may further include a second external conductive prong that extends outward from the non-conductive body. The second external conductive prong is selectively electrically coupleable to the non-contact electrical detector, the second external conductive prong is configured to be inserted into a ground receptacle of an electrical outlet.

The external conductive prong may be a first external conductive prong, and the accessory may further include a second external conductive prong that extends outward from the non-conductive body. The second external conductive prong is selectively electrically coupleable with the internal conductive prong. The accessory may further include a switch that selectively electrically couples the first and second external conductive prongs to the internal conductive prong. The switch may be selectively positioned in a first position that electrically couples the first external conductive prong to the internal conductive prong while the second external conductive prong is not coupled to the internal conductive prong. The switch may be selectively positioned in a second position that electrically couples the second external conductive prong to the internal conductive prong while the first external conductive prong is not coupled to the internal conductive prong.

These features may include a method including: removably positioning an accessory in a receiving structure of a non-contact electrical detector; Inserting an external conductive prong of the accessory into a receptacle of an electrical outlet; switching a switch in the accessory to be electrically coupled to the external conductive prong; detecting an electrical characteristic in the accessory using a non-contact electrical sensor of the non-contact electrical detector; and outputting an indication of the electrical characteristic detected by the non-contact electrical sensor.

The external conductive prong may be a first external conductive prong and the receptacle may be a first receptacle, the method may further include inserting a second external conductive prong of the accessory into a second receptacle of the electrical outlet.

Detecting the electrical characteristic in the accessory may further include detecting the electrical characteristic in an internal conductive prong within the accessory. The electrical characteristic may be one of a respective electrical characteristic of the first external conductive prong or the second external conductive prong.

Inserting the second external conductive prong of the accessory into the second receptacle of the electrical outlet may ground the non-contact electrical detector. As will be appreciated, the various embodiments described above can be combined to provide yet further embodiments. Aspects of the embodiments can be modified, if necessary to employ concepts of the present invention disclosed herein. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An accessory, comprising:
a non-conductive body;
an internal conductive prong within the non-conductive body;
a first external conductive prong that extends outward from the non-conductive body, wherein the first external conductive prong is selectively electrically coupleable with the internal conductive prong;
a second external conductive prong that extends outward from the non-conductive body, wherein the second external conductive prong is selectively electrically coupleable with the internal conductive prong, and the second external conductive prong is electrically isolated from the first external conductive prong; and a switch that selectively electrically couples the first external conductive prong and the second external conductive prong to the internal conductive prong, the switch having:

a first position that electrically couples the first external conductive prong to the internal conductive prong while the second external conductive prong is decoupled from the internal conductive prong; and a second position that electrically couples the second external conductive prong to internal conductive prong while the first external conductive prong is decoupled from the internal conductive prong, wherein the first and second external conductive prongs are configured to be inserted into respective first and second receptacles of an electrical outlet to electrically couple the first and second external conductive prongs to the respective first and second receptacles of the electrical outlet.

2. The accessory of claim 1, wherein the internal conductive prong is a first internal conductive prong, the accessory further comprising a second internal conductive prong within the non-conductive body, wherein:

the first internal conductive prong is electrically coupled to the first external conductive prong; and the second internal conductive prong is electrically coupled to the second external conductive prong.

3. The accessory of claim 2, wherein:

the first internal conductive prong is electrically coupled to the first external conductive prong by at least a first electrical wire; and the second internal conductive prong is electrically coupled to the second external conductive prong by at least a second electrical wire.

4. The accessory of claim 1, further comprising:

a third external conductive prong extending outward from the non-conductive body, wherein the third external conductive prong is configured to be inserted into a third receptacle of the electrical outlet to electrically couple the third external conductive prong to the third receptacle of the electrical outlet.

5. The accessory of claim 1, wherein, in use, the non-conductive body of the accessory positions the internal conductive prong within a sensing area of a non-contact electrical sensor without galvanically contacting the non-contact electrical sensor.

6. A system, comprising:

a non-contact electrical detector including:
a housing; and
a non-contact electrical sensor; and an accessory configured to be positionable in a form factor of the non-contact electrical detector that is configured to receive the accessory, the accessory including:

a non-conductive body configured to be removably inserted into the form factor of the non-contact electrical detector;

an internal conductive prong positioned within the non-conductive body; and an external conductive prong that extends outward from the non-conductive body, the external conductive prong being electrically coupled, or selectively electrically coupleable, with the internal conductive prong.

7. The system of claim 6, wherein the external conductive prong is configured to be inserted into a receptacle of an electrical outlet to electrically couple the external conductive prong to the receptacle of the electrical outlet.

8. The system of claim 6, wherein the external conductive prong is a first external conductive prong, and the accessory further includes:

a second external conductive prong extending outward from the non-conductive body.

9. The system of claim 8, wherein:

the first external conductive prong is configured to be inserted into a first receptacle of an electrical outlet to electrically couple the first external conductive prong to the first receptacle of the electrical outlet; and the second external conductive prong is configured to be inserted into a second receptacle of the electrical outlet to electrically couple the second external conductive prong to the second receptacle of the electrical outlet.

10. The system of claim 6, wherein the non-contact electrical detector includes:

a receiving structure integral with the housing, the receiving structure having the form factor configured to removably receive the accessory, the receiving structure including:

a first extension of the housing;
a second extension of the housing; and
a gap between the first extension and the second extension, the accessory being removably positionable within the gap between the first and second extensions, wherein the first extension, the second extension, and the gap delimit the form factor of the receiving structure configured to receive the accessory;

wherein the non-contact electrical sensor is positioned within the housing proximate to the gap such that a sensing area of the non-contact electrical sensor extends into the gap to detect an electrical characteristic of the internal conductive prong within the accessory when the accessory is positioned within the gap of the receiving structure.

11. The system of claim 6, wherein the non-contact electrical detector includes:

a clamp having the form factor configured to removably receive the accessory, the clamp being in mechanical cooperation with the housing of the non-contact electrical detector, the clamp including:

a first clamp arm extending outward from the housing and having a first end; and a second clamp arm extending outward from the housing and having a second end, the first end of the first clamp arm being biased toward the second end of the second clamp arm to removably clamp the accessory;

wherein the non-contact electrical sensor is positioned proximate the first end of the first clamp arm or the second end of the second clamp arm to detect an electrical characteristic of the internal conductive prong within the accessory.

12. The system of claim 6, wherein the non-contact electrical sensor is a non-contact voltage (NCV) sensor configured to detect a voltage.

13. The system of claim 6, wherein the external conductive prong is a first external conductive prong, the accessory further including:

a second external conductive prong that extends outward from the non-conductive body, wherein the second external conductive prong is selectively electrically coupleable to the non-contact electrical detector, the second external conductive prong is configured to be inserted into a ground receptacle of an electrical outlet.

14. The system of claim 6, wherein the external conductive prong is a first external conductive prong, the accessory further including:
a second external conductive prong that extends outward from the non-conductive body, wherein the second external conductive prong is selectively electrically coupleable with the internal conductive prong;
a switch that selectively electrically couples the first and second external conductive prongs to the internal conductive prong, the switch being selectively positioned in:
a first position that electrically couples the first external conductive prong to the internal conductive prong while the second external conductive prong is not coupled to the internal conductive prong; and
a second position that electrically couples the second external conductive prong to the internal conductive prong while the first external conductive prong is not coupled to the internal conductive prong.

15. An accessory, comprising:
a non-conductive body;
an internal conductive prong within the non-conductive body; and
a first external conductive prong that extends outward from the non-conductive body;
a second external conductive prong that extends outward from the non-conductive body;
a switch in the non-conductive body, the switch is configured to, in operation, selectively electrically couple the first external conductive prong and the second external conductive prong to the internal conductive prong, the switch having:
a first position that electrically couples the first external conductive prong to the internal conductive prong while the second external conductive prong is decoupled from the internal conductive prong; and
a second position that electrically couples the second external conductive prong to internal conductive prong while the first external conductive prong is decoupled from the internal conductive prong.

16. The accessory of claim 15, wherein:
the non-conductive body is configured to, in operation, be received by a receiving structure of a non-contact electrical detector integral with a housing of the non-contact electrical detector, the receiving structure having a form factor configured to removably receive the non-conductive body, the receiving structure including:
a first extension of the housing;
a second extension of the housing; and
a gap between the first extension and the second extension, the non-conductive body being removably positionable within the gap between the first and second extensions, wherein the first extension, the second extension, and the gap delimit the form factor of the receiving structure configured to receive the non-conductive body;
wherein a non-contact electrical sensor of the non-contact electrical detector is positioned within the housing proximate to the gap such that a sensing area of the non-contact electrical sensor extends into the gap to detect an electrical characteristic of the internal conductive prong within the accessory when the accessory is positioned within the gap of the receiving structure.

17. The accessory of claim 15, wherein:
the non-conductive body is configured to, in operation, be received by a clamp of a non-contact electrical detector having the form factor configured to removably receive the non-conductive body, the clamp being in mechanical cooperation with a housing of the non-contact electrical detector, the clamp including:
a first clamp arm extending outward from the housing and having a first end; and
a second clamp arm extending outward from the housing and having a second end, the first end of the first clamp arm being biased toward the second end of the second clamp arm to removably clamp the non-conductive body;
wherein a non-contact electrical sensor of the non-contact electrical detector is positioned proximate the first end of the first clamp arm or the second end of the second clamp arm to detect an electrical characteristic of the internal conductive prong within the non-conductive body.

18. The accessory of claim 16, wherein:
the first external conductive prong is configured to be inserted into a first receptacle of an electrical outlet to electrically couple the first external conductive prong to the first receptacle of the electrical outlet; and
the second external conductive prong is configured to be inserted into a second receptacle of the electrical outlet to electrically couple the second external conductive prong to the second receptacle of the electrical outlet.

* * * * *